(12) United States Patent
Asao

(10) Patent No.: US 8,644,059 B2
(45) Date of Patent: Feb. 4, 2014

(54) SEMICONDUCTOR STORAGE DEVICE

(75) Inventor: Yoshiaki Asao, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 9 days.

(21) Appl. No.: 13/419,258

(22) Filed: Mar. 13, 2012

(65) Prior Publication Data

US 2012/0281461 A1 Nov. 8, 2012

(30) Foreign Application Priority Data

May 6, 2011 (JP) ................................ 2011-103761

(51) Int. Cl.
*G11C 11/00* (2006.01)
(52) U.S. Cl.
USPC .......................................... 365/158; 365/173
(58) Field of Classification Search
USPC ................................................. 365/158, 173
See application file for complete search history.

(56) References Cited

U.S. PATENT DOCUMENTS

2003/0223283 A1* 12/2003 Kunikiyo ...................... 365/200
2010/0238718 A1   9/2010 Asao

FOREIGN PATENT DOCUMENTS

JP 2010-225783 7/2010

OTHER PUBLICATIONS

Hosomi, M. et al, A Novel Nonvolatile Memory with Spin Torque Transfer Magnetization Switching: Spin-RAM, IEDM Tech Dig., 2005 pp. 473-476.
Lin et al., "45nm Low Power CMOS Logic Compatible Embedded STT MRAM Utilizing a Reverse-Connection 1T/1MTJ Cell," IEDM Tech. Dig., 2009, pp. 279-282.

* cited by examiner

*Primary Examiner* — Michael Tran
(74) *Attorney, Agent, or Firm* — Knobbe Martens Olson & Bear LLP

(57) ABSTRACT

A memory includes MTJ elements. Active areas are separated to correspond to cell transistors, respectively, and extend in a first direction substantially orthogonal to an extending direction of gates of the cell transistors. The active areas are arranged in the first direction and constitute a plurality of active area columns. Two active area columns adjacent in a second direction are arranged to be half-pitch staggered in the first direction. As viewed from above surfaces of the active areas, each MTJ element is arranged to overlap with one end of each of the active areas. The first and second wirings extend while being folded back in a direction inclined with respect to the first and second directions in order to overlap with the MTJ elements alternately in the adjacent active area columns.

18 Claims, 20 Drawing Sheets

SEMICONDUCTOR STORAGE DEVICE

CROSS REFERENCE TO RELATED APPLICATIONS

This application is based upon and claims the benefit of priority from the prior Japanese Patent Application No. 2011-103761, filed on May 6, 2011, the entire contents of which are incorporated herein by reference.

FIELD

The embodiments of the present invention relate to a semiconductor storage device.

BACKGROUND

A magnetic random access memory (MRAM) is a type of a resistance change memory. As techniques for writing data to the MRAM, magnetic field writing and spin-transfer torque writing have been known. Among these techniques, the spin-transfer torque writing has advantages in higher integration, lower power consumption, and higher performance because of the property of a spin-transfer torque device that a smaller amount of a spin injection current is necessary for magnetization reversal as the size of magnetic bodies becomes smaller.

A spin-transfer torque MTJ (Magnetic Tunnel Junction) element has a stacked structure in which a nonmagnetic barrier layer (an insulating thin film) is sandwiched between two ferromagnetic layers, and stores data by a change in a magnetic resistance caused by spin-polarized tunneling. The MTJ element can be switched into a low resistance state or a high resistance state depending on the magnetization orientations of the two ferromagnetic layers. The MTJ element is in a low resistance state when the magnetization orientations (spin directions) of the two ferromagnetic layers are in a parallel state (a P state), and in a high resistance state when the magnetization orientations (spin directions) thereof are in an anti parallel state (an AP state).

Generally, a write current $I^{P-AP}$ for reversing the P state to the AP state is higher than a write current $I^{AP-P}$ for reversing the AP state to the P state. If a source line is biased to a higher voltage than a bit line when the write current $I^{P-AP}$ is applied to the MTJ element, the source voltage of a cell transistor increases due to the voltage drop of the MTJ element. Accordingly, the increased source voltage reduces the voltage difference between a source and a gate, and the back bias effect as well as this increased source voltage degrades the current driving capability of the cell transistor when the write $I^{AP-P}$ is applied to the MTJ element.

To solve these problems, it is conceived to stack the pinned layer and the free layer of the MTJ element in an inverse order. The MTJ element is normally configured to stack a free layer, a tunnel barrier, and a pinned layer from top down. By configuring the MTJ element to stack the pinned layer, the tunnel barrier, and the free layer from top down, the source line is biased to the higher voltage than the bit line when a relatively low write current $I^{P-AP}$ is applied. This can suppress the source voltage from increasing. However, with the configuration of the MTJ element to stack the pinned layer, the tunnel barrier, and the free layer from top down, the lower free layer is separated from a mask at the time of processing MTJ element, disadvantageously resulting in a variation in the size of the free layer among MTJ elements. The variation in the size of the free layer leads to variations in signals among memory cells.

Furthermore, it has been desired to downscale MRAMs like DRAMs.

DETAILED DESCRIPTION

A semiconductor storage device according to the present embodiment comprises MTJ elements. Active areas in the semiconductor storage device are separated to correspond to cell transistors, respectively, and extend in a first direction substantially orthogonal to an extending direction of gates of the cell transistors. The active areas are arranged in the first direction and constitute a plurality of active area columns. Two active area columns adjacent in a second direction are arranged to be staggered in the first direction by a half-pitch of the active area. As viewed from above surfaces of the active areas, each of the MTJ elements is arranged to overlap with one end of each of the active areas. The first and second wirings extend while being folded back in a direction inclined with respect to the first and second directions in order to overlap with the MTJ elements alternately in the adjacent active area columns.

Embodiments will now be explained with reference to the accompanying drawings.

First Embodiment

Figure 1:
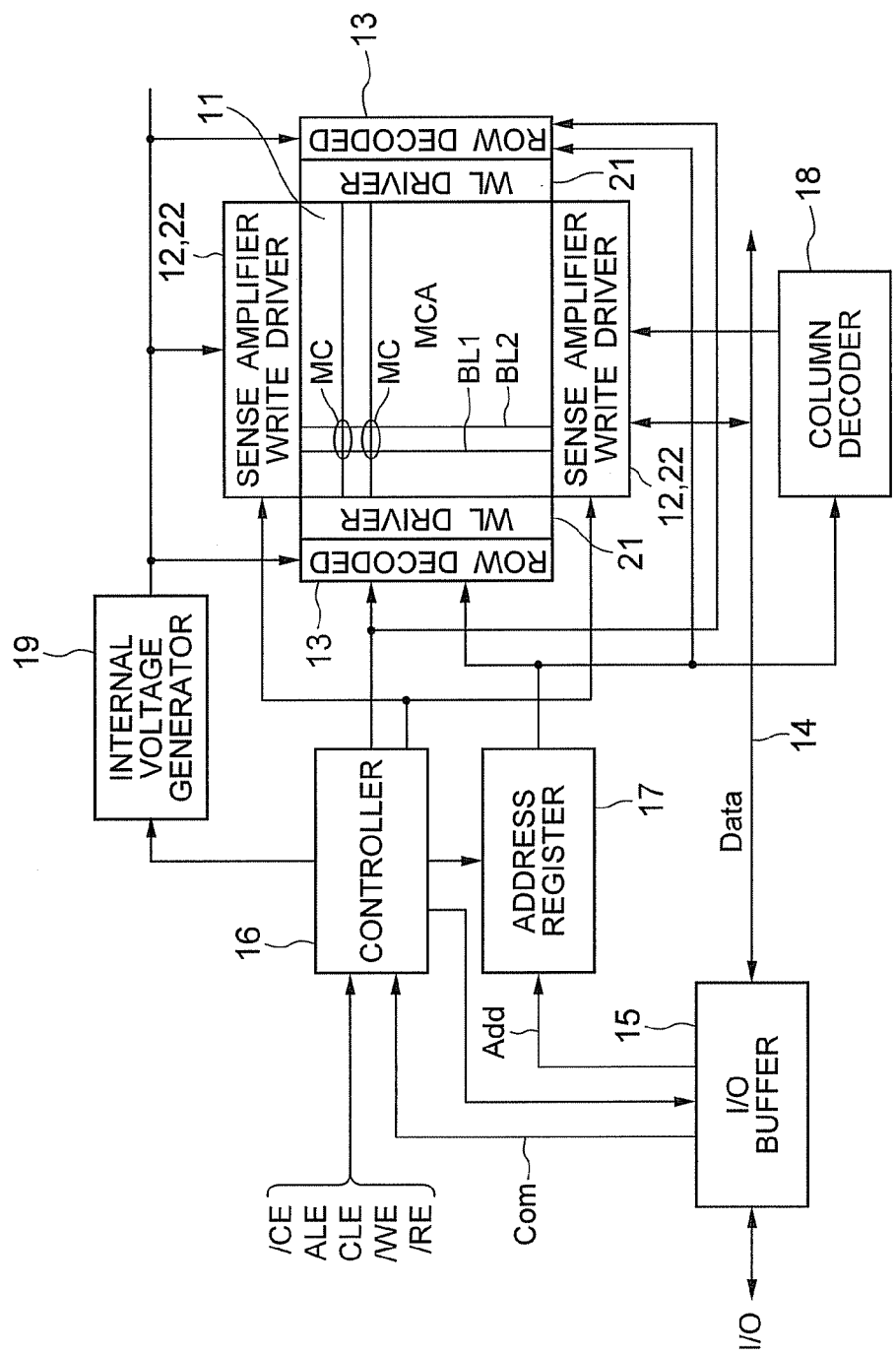
FIG. 1 is a block diagram showing a configuration of an MRAM according to a first embodiment.
Figure 2:
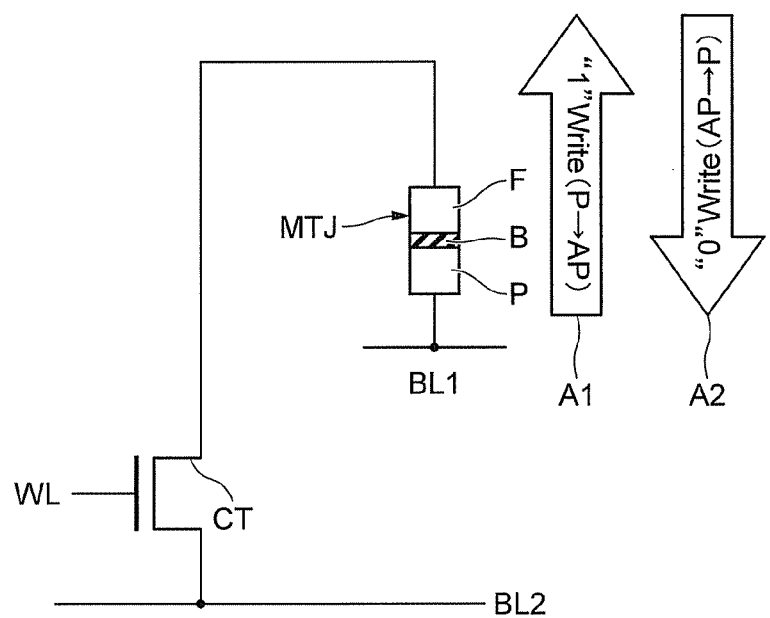
FIG. 2 is an explanatory diagram showing the data writing operation for writing data to one memory cell MC according to the first embodiment.

FIG. 1 is a block diagram showing a configuration of an MRAM according to a first embodiment. A plurality of memory cells MC are arranged two-dimensionally in a memory cell array 11. Each memory cell MC includes an MTJ element and a cell transistor CT, as shown in FIG. 2 to be described later. The MTJ element is a magnetic tunnel junction element that stores data by a change in a resistance state, and data stored in the MTJ element is rewritable by a current. The cell transistor CT is provided to correspond to one MTJ element and configured to set in a conductive state when a current is applied to the corresponding MTJ element.

A plurality of word lines WL are arranged in a row direction and a plurality of bit lines BL are arranged to in a column direction. The word lines WL and the bit lines BL are arranged to intersect one another. Two adjacent bit lines BL are paired, and the memory cells MC are provided to correspond to intersections between the word lines WL and paired bit lines (a first bit line BL1 and a second bit line BL2, for example), respectively. The MTJ element and the cell transistor CT of each memory cell MC are connected in series between the paired bit lines BL (BL1 and BL2, for example). A gate of the cell transistor CT is connected to one word line WL.

Sense amplifiers 12 and a write driver 22 are arranged on each side of the memory cell array 11 in the bit line direction, that is, the column direction. The sense amplifiers 12 are connected to the corresponding bit lines BL, respectively. Each of the sense amplifiers 12 senses a current flowing to the memory cell MC connected to a selected word line WL, thereby reading data stored in the memory cell MC. The write driver 22 is connected to the bit lines BL, and writes data to the memory cell MC connected to the selected word line WL by applying the current to the memory cell MC.

A row decoder 13 and a word line driver 21 are arranged on each side of the memory cell array 11 in the word line direction, that is, the row direction. The word line driver 21 is connected to the word lines WL and configured to apply a voltage to the selected word line WL during a data reading or data writing operation.

The sense amplifier 12 or write driver 22 transmits and receives data to and from an external input/output terminal I/O via a data bus 14 and an I/O buffer 15.

For example, various external control signals, a chip enable signal /CE, an address latch enable signal ALE, a command latch enable signal CLE, a write enable signal /WE, and a read enable signal /RE are input to a controller 16. The controller 16 identifies an address Add and a command Com supplied from the input/output terminal I/O on the basis of these control signals. The controller 16 transfers the address Add to the row decoder 13 and a column decoder 18 via an address register 17. In addition, the controller 16 decodes the command Com. Each sense amplifier 12 is configured to be able to apply a voltage to the corresponding bit line BL in response to a column address decoded by the column decoder 18. The word line driver 21 is configured to be able to apply a voltage to the selected word line WL in response to a row address decoded by the row decoder 13.

The controller 16 controls sequences of the data reading operation, the data writing operation, and a data erasing operation in response to the external control signals and commands. An internal voltage generator 19 is provided to generate internal voltages necessary for operations (such as a voltage stepped up from a power supply voltage). This internal voltage generator 19 performs a boosting operation and generates the necessary voltages under the control of the controller 16.

FIG. 2 is an explanatory diagram showing the data writing operation for writing data to one memory cell MC according to the first embodiment. The MTJ element that uses the TMR (tunneling magnetoresistive) effect has a stacked structure in which a nonmagnetic layer (a tunnel dielectric film) B is sandwiched between two ferromagnetic layers F and P. The MTJ element stores digital data by the change in a magnetic resistance due to the spin-polarized tunneling. The MTJ element can be set in a low resistance state or a high resistance state depending on magnetization orientations of the two ferromagnetic layers F and P. For example, if it is defined that the low resistance state indicates data "0" and that the high resistance state indicates data "1", one-bit data can be recorded in the MTJ element. Alternatively, it can be defined that the low resistance state indicates data "1" and that the high resistance state indicates data "0".

For example, the MTJ element is configured to stack a pinned layer P, a tunnel barrier layer B, and a recording layer (a free layer) F from bottom up in this order. The pinned layer P and the free layer F are made of ferromagnetic bodies and the tunnel barrier layer B is an insulating film (made of $AL_2O_3$ or MgO, for example). The pinned layer P has a fixed magnetization orientation. The free layer F has a variable magnetization orientation. The MTJ element stores data depending on the magnetization orientation of the free layer F.

During the data writing operation, a current flows to the MTJ element in a direction of an arrow A1. In this case, the magnetization orientation of the free layer F is anti parallel (in the AP state) to that of the pinned layer P, whereby the MTJ element is in the high resistance state (data "1"). During the data writing operation, a current flows to the MTJ element in a direction of an arrow A2. In this case, the magnetization orientation of the free layer F is parallel (in the P state) to that of the pinned layer P, whereby the MTJ element is in the low resistance state (data "0"). In this way, different data can be written to the MTJ element depending on a current flow direction.

In the first embodiment, the free layer F is connected to the bit line BL2 via the cell transistor CT. The pinned layer P is connected to the bit line BL1 without via the cell transistor CT. In this case, when the current $I^{P-AP}$ flows to the MTJ element as indicated by the arrow A1, the source of the cell transistor CT is connected to the bit line BL2. This can suppress the source voltage from increasing and the back bias effect, so that the current driving capability of the cell transistor CT can be kept high. That is, when the write current $I^{P-AP}$ higher than the write current $I^{AP-P}$ flows to the MTJ element, the current driving capability of the cell transistor CT is kept high. This enables the MRAM according to the first embodiment to change the state of each MTJ element from the P state to the AP state easily, in a short time, and sufficiently.

The write current $I^{AP-P}$ can be set relatively low. Therefore, no problem occurs when the state of the MTJ element changes from the AP state to the P state, even if the current driving capability of the cell transistor CT slightly degrades.

Figure 3:
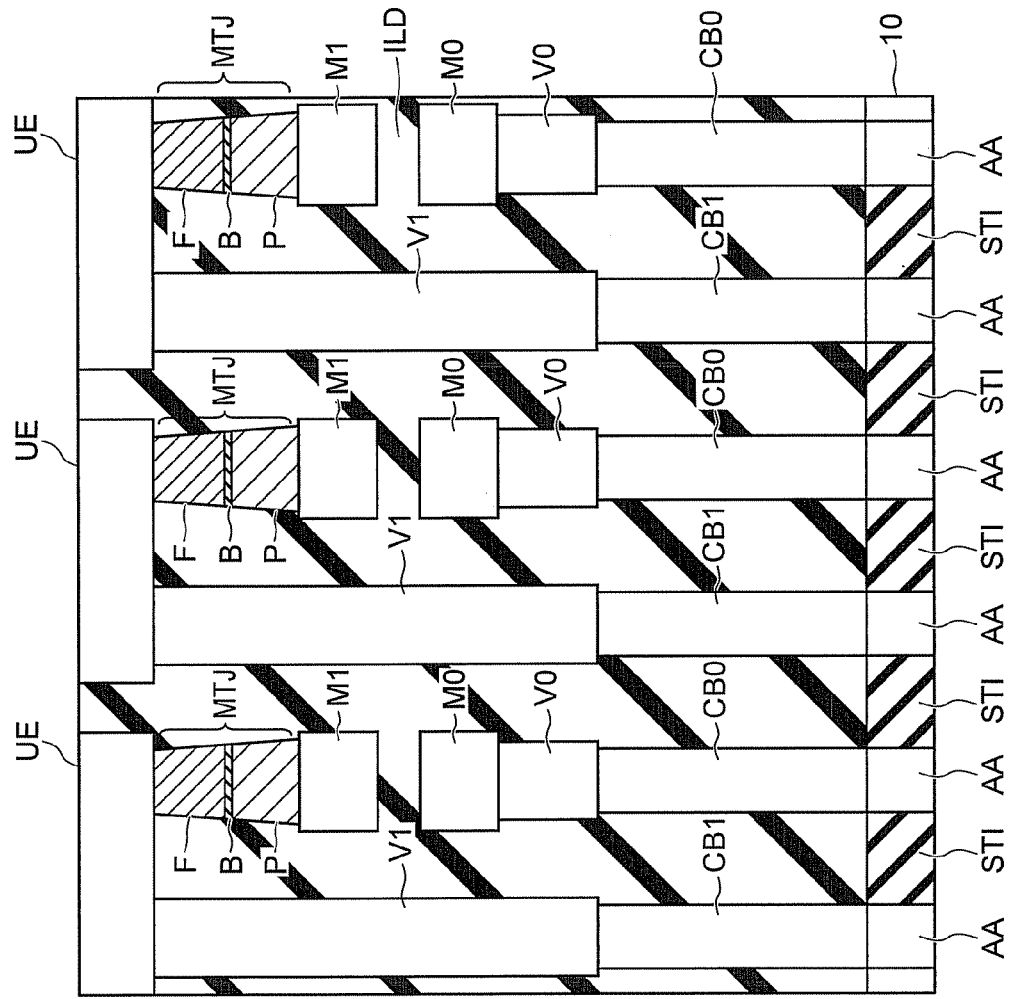
FIG. 3 is a cross-sectional view of the MRAM according to the first embodiment.

FIG. 3 is a cross-sectional view of the MRAM according to the first embodiment. Active areas AA and element isolation regions STI (Shallow Trench Isolation) are alternately formed on a semiconductor substrate 10. Although the cell transistors CT are formed in the active areas AA, FIG. 3 only shows source or drain diffusion layers of the cell transistors CT.

In each MTJ element, the tunnel dielectric film B is provided on the pinned layer P and the free layer F is provided on the tunnel dielectric film B. That is, the pinned layer P is closest to the semiconductor substrate 10 among the pinned layer P, the tunnel dielectric film B, and the free layer F. In addition, the tunnel dielectric film B is stacked on the pinned layer P, and the free layer F is stacked on the tunnel dielectric film B.

Generally, side surfaces of each MTJ element are formed to be forward tapered as shown in FIG. 3. In this case, at the time of processing the MTJ elements, sizes (widths) of the free layers F closer to a mask are difficult to vary among the memory cells MC. On the other hand, at the time of processing the MTJ elements, sizes (widths) of the pinned layers P farthest from the mask are easy to vary among the memory cells MC as compared with those of the free layers F. The variation in the size of the free layer F has a greater influence on read signals than that of the pinned layer P. Therefore, when the variation in the size of the free layer F is reduced, it is possible to suppress the variation in signals among the memory cells MC.

When the free layer F is provided to be the closest to the semiconductor substrate 10, the tunnel dielectric film B is stacked on the free layer F, the pinned layer P is stacked on the tunnel dielectric film B, the variation in the size of the free layer F increases. This possibly increases the variation in the signals among the memory cells MC. The MRAM according to the first embodiment can suppress such a variation in the signals.

A metal wiring M1 serving as a first wiring is electrically connected to each pinned layer P. An upper electrode UE is electrically connected to each free layer F. The upper electrode UE is connected to a via contact V1 serving as a first contact. The via contact V1 is connected to the diffusion layer (for example, the drain) on one end of the cell transistor CT formed in the active area AA via a contact plug CB1. The free layer F is thereby electrically connected to the diffusion layer on one end of the cell transistor CT via the upper electrode UE, the via contact V1, and the contact plug CB1.

A metal wiring M0 serving as a second wiring is connected to one via contact V0 serving as a second contact. The via contact V0 is electrically connected to the diffusion layer (for example, the source) on the other end of the cell transistor CT via a contact plug CB0. The second wiring M0 is thereby electrically connected to the diffusion layer on the other end of the cell transistor CT via the via contact V0 and the contact plug CB0.

The second wiring M0 is provided below the first wiring M1 and electrically isolated from the first wiring M1 by an interlayer dielectric film ILD. The first wiring M1, as viewed from above a surface of the semiconductor substrate 10 (from above a surface of the active area AA), overlaps with the second wiring M0. The MTJ element, as viewed from above the surface of the semiconductor substrate 10, overlaps with the first and second wirings M1 and M0.

Although the bit lines BL are not shown in FIG. 3, these lines extend in a perpendicular direction to a plane of the drawing of FIG. 3.

Figure 4:
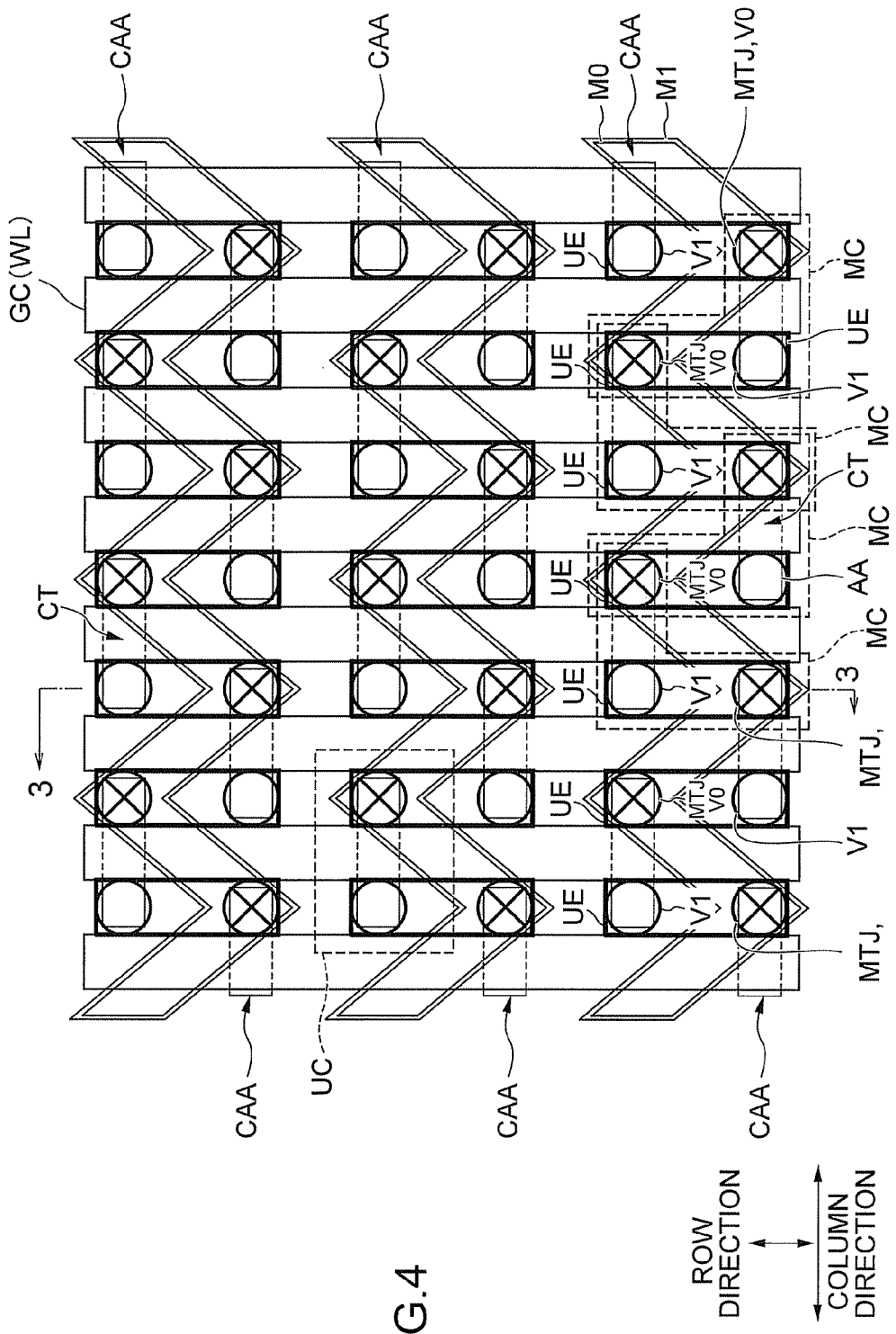
FIG. 4 is a plan layout view of the MRAM according to the first embodiment.

FIG. 4 is a plan layout view of the MRAM according to the first embodiment. The cross-sectional view of FIG. 3 corresponds to a cross-section taken along a line 3-3 of FIG. 4. In the first embodiment, a plurality of active areas AA are separated to correspond to the respective cell transistors CT, and extend in the column direction (first direction) substantially orthogonal to an extending direction of gate electrodes GC (the word lines WL) of the cell transistors CT. The cell transistors CT are formed to provide channels at intersections between the active areas AA and the gate electrodes GC (the word lines WL), respectively. A plurality of active areas AA are arranged in the column direction and constitute a plurality of active area columns CAA. In the two active area columns CAA adjacent in the row direction (second direction) substantially parallel to the extending direction of the gate electrodes GC, the active areas AA are arranged to be staggered (shifted) in the column direction by a half-pitch of the memory cell MC or a unit cell UC. The element isolation regions STI are formed to surround the active areas AA.

Each MTJ element is arranged to overlap with one end of one active area AA as viewed from above the surface of the semiconductor substrate 10 (in a plan layout). In FIG. 4, the MTJ element overlaps with a right end of the active area AA. As shown in FIG. 3, the via contact V0 is provided below each MTJ element. Therefore, in the plan layout, the via contact V0 overlaps with the MTJ element. The contact plug CB0 provided below each via contact V0, as shown in FIG. 3, also overlaps with the MTJ element.

Each via contact V1 is arranged to overlap with the other end of one active area AA in the plan layout. In FIG. 4, the via contact V1 overlaps with a left end of the active area AA. The contact plug CB1 provided below each via contact V1, as shown in FIG. 3, also overlaps with the other end of the active area AA.

The gate electrode GC of each cell transistor CT is provided between the contact plugs CB0 and CB1. The gate electrode GC is provided on a gate dielectric film (not shown) provided on the active area AA. The gate electrode GC extends in the row direction and also functions as the word line WL.

In the two active area columns CAA adjacent in the row direction, in which the active areas AA are half-pitch staggered in the column direction, each MTJ element is adjacent to the via contact V1 in the row direction. Therefore, each upper electrode UE can connect the free layer F of the MTJ element and the via contact V1 adjacent in the row direction by extending in the row direction. That is, the upper electrode UE connects the free layer F of the MTJ element overlapping with a first active area AA to the via contact V1 overlapping with a second active area adjacent to the first active area AA in the column direction. The upper electrode UE can thereby connect the MTJ element and the cell transistor CT in series between the first wiring M1 and the second wiring M0.

The first and second wirings M1 and M0 extend to be folded back in a direction inclined with respect to the row and column directions so as to alternately overlap with the MTJ elements in the two adjacent active area columns CAA. That is, the first and second wirings M1 and M2 extend to meander between the two adjacent active area columns CAA while repeatedly forming a W-shape. The extending direction of the first and second wirings M1 and M0 inclines at about 45 degrees with respect to the row or column direction.

As described above, the pinned layer P located in a lower portion of each MTJ element is connected to the bit line BL1 via the first wiring M1. The free layer F located in an upper portion of the MTJ element is connected to the via contact V1 adjacent to the free layer F in the row direction via the upper electrode UE, and electrically connected to the diffusion layer on one end of the cell transistor CT via the via contact V1 and the contact plug CB1. That is, the MTJ element provided to overlap with one certain active area column CAA is connected to the cell transistor CT formed in the other active area column CAA adjacent to the certain active area column CAA via the upper electrode UE.

The second wiring M0 overlaps with a portion right under the first wiring M1, and is electrically connected to the diffusion layer on the other end of the cell transistor CT via the via contact V0 and the contact plug CB0. The diffusion layer on the other end of the cell transistor CT is connected to the bit line BL2 via the second wiring M0.

The cell transistor CT and the MTJ element are thereby connected in series between the paired bit lines BL1 and BL2. As shown in FIG. 4, the memory cells MC are provided in the form of an L-shape over the two active area columns CAA adjacent in the row direction. A plurality of memory cells MC are arranged continuously over the two adjacent active area columns CAA, thereby providing the memory cells MC in a convex-concave fashion so as to extend in the column direction in the plan layout.

The size of one unit of the memory cells MC (the size of a unit cell UC) according to the first embodiment is $8F^2$ (4F× 2F). The symbol F indicates a minimum feature size when using lithography and etching.

In the data writing or data reading operation, the gate electrode GC (the word line WL) corresponding to one certain memory cell MC is driven so as to select the certain memory cell MC. A plurality of cell transistors CT connected to the selected word line WL and arranged in the row direction thereby become conductive. By applying a voltage difference to the paired bit lines BL1 and BL2 in one certain column, the memory cell MC corresponding to the intersections between the selected word line WL and the selected paired bit lines BL1 and BL2 can be selected, and a current can flow to the MTJ element of the selected memory cell MC via the cell transistor CT.

In the MRAM according to the first embodiment, the free layer F of each MTJ element is connected to the cell transistor CT. This can keep high the current driving capability of the cell transistor CT when the relatively high write current $I^{P-AP}$ is applied. Therefore, the state of the MTJ element can be changed from the P state to the AP state easily, in a short time, and sufficiently.

Furthermore, in the MTJ element according to the first embodiment, the pinned layer P is closest to the semiconductor substrate 10 among the pinned layer P, the tunnel dielectric film B, and the free layer F, the tunnel dielectric film B is stacked on the pinned layer P, and the free layer F is stacked on the tunnel dielectric film B. This can reduce the variation in the size of the free layer F among a plurality of memory cells MC, so that the variation in the signals among the memory cells MC can be suppressed.

Further, the MRAM according to the first embodiment has a layout configuration as shown in FIG. 4, whereby the size of the unit cell UC can be made as small as $8F^2$. The size of the MRAM can be made smaller because the first and second wirings M1 and M2 overlap with each other in the plan layout.

In the MRAM according to the first embodiment, a plurality of MTJ elements are arranged uniformly in a square grid pattern in the plan layout. That is, the MTJ elements are arranged equidistantly two-dimensionally in the row and column directions. This facilitates processing the MTJ elements by the lithography and etching, and can suppress the variation in the size of the MTJ element. The via contacts V1 and V0 are also arranged uniformly in a square grid pattern in the plan layout. This facilitates processing the via contacts V1 and V0 by the lithography and etching.

The first embodiment is also applicable to an MRAM using fully depleted transistors such as a Fin-type FET (Field Effect Transistor) as the cell transistors CT.

Second Embodiment

Figure 5:
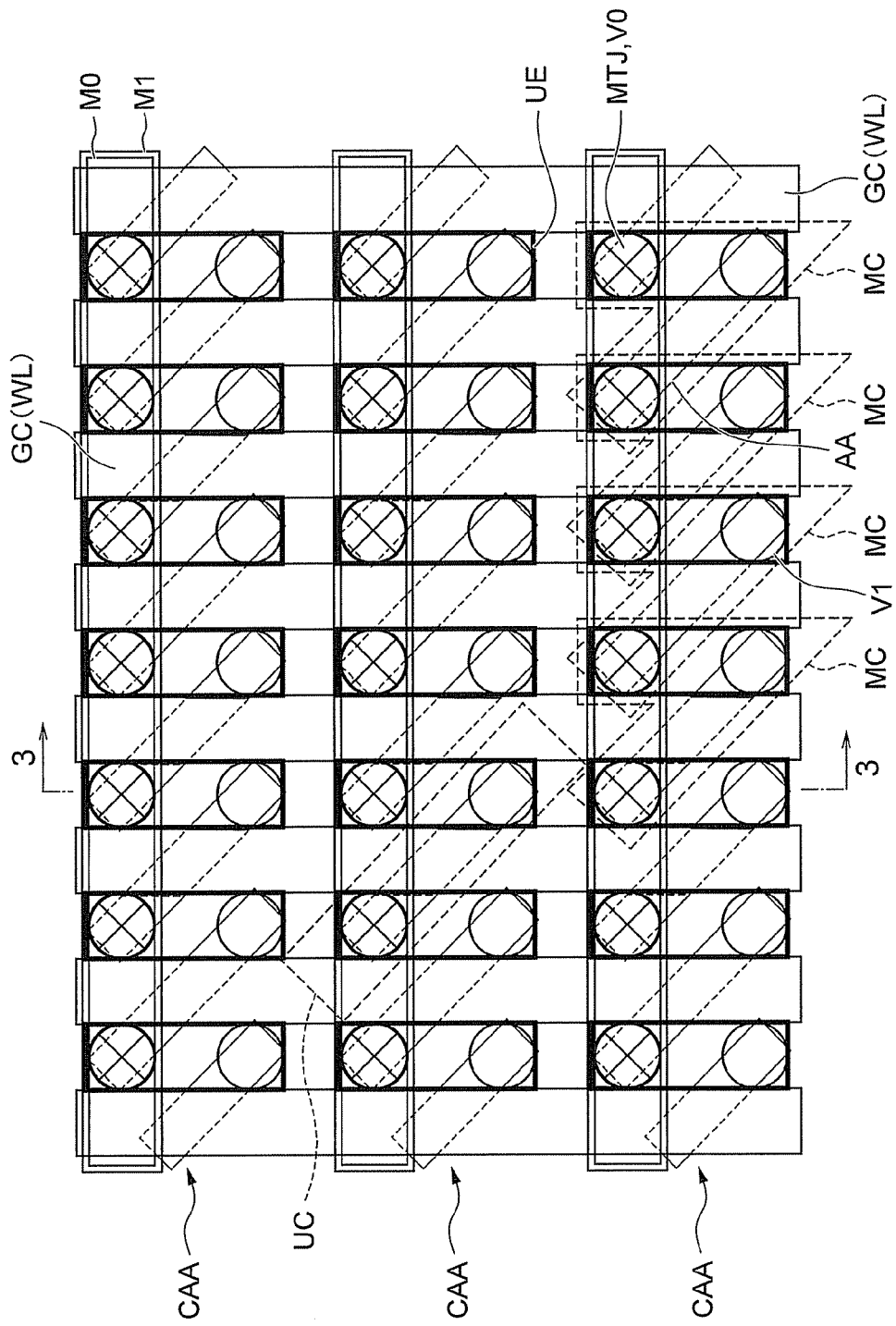
FIG. 5 is a plan layout view of an MRAM according to a second embodiment.

FIG. 5 is a plan layout view of an MRAM according to a second embodiment. A cross-section taken along a line 3-3 of FIG. 5 corresponds to the cross-sectional view of FIG. 3. The overall configuration of the MRAM and the configuration of the memory cell MC shown in FIGS. 1 and 2 can be applied to that of the MRAM and that of the memory cell MC according to the second embodiment, respectively.

In the second embodiment, a plurality of active areas AA are separated to correspond to the respective cell transistors CT, and extend in the direction inclined with respect to the row and column directions. The extending direction of the active areas AA inclines at about 45 degrees with respect to the row or column direction.

A plurality of active areas AA are arranged in the column direction and constitute a plurality of active area columns CAA. In the two active area columns CAA adjacent in the row direction, the active areas AA are arranged in line in the column direction without being staggered.

Each MTJ element is arranged to overlap with one end of one active area AA as viewed from above the surface of the semiconductor substrate 10. In FIG. 5, the MTJ element overlaps with an upper left end of the active area AA. As shown in FIG. 3, the via contact V0 is provided below each MTJ element. Therefore, in the plan layout, the via contact V0 overlaps with the MTJ element. The contact plug CB0 provided below each via contact V0, as shown in FIG. 3, also overlaps with the MTJ element.

Each via contact V1 is arranged to overlap with the other end of one active area AA in the plan layout. In FIG. 5, the via contact V1 overlaps with a lower right end of the active area AA. The contact plug CB1 provided below each via contact V1, as shown in FIG. 3, also overlaps with the other end of the active area AA.

The gate electrode GC of each cell transistor CT (the word line WL) is configured similarly to that according to the first embodiment.

In the two adjacent active areas AA in the same active area column CAA, the active areas AA are arranged so that one end of one active area AA is adjacent to the other end of the other active area AA in the row direction. For example, an upper left end of the first active area AA overlapping with the MTJ element is adjacent to a lower right end of the second active area AA adjacent to the first active area AA in the column direction. Therefore, in the two active area columns CAA adjacent in the row direction, the active areas AA are not half-pitch staggered. In addition, each upper electrode UE can connect the free layer F of the MTJ element overlapping with the first active area AA to the via contact V1 overlapping with the second active area AA although extending in the row direction without being inclined. The upper electrode UE can thereby connect the MTJ element and the cell transistor CT in series between the first wiring M1 and the second wiring M0.

Furthermore, the MTJ elements and the via contacts V0 can be arranged linearly in the column direction by forming the active areas AA to be inclined with respect to the row and column directions as described in the second embodiment. It thereby suffices to form the first and second wirings M1 and M0 linearly so as to extend in the column direction. That is, it suffices to form the first and second wirings M1 and M0 linearly in the column direction so as to overlap with the MTJ elements of each active area column CAA. This can facilitate processing the first and second wirings M1 and M2 in a manufacturing process.

The second embodiment is compared with the first embodiment. In the first embodiment, the active areas AA and the upper electrodes UE extend in the row and column directions, respectively (extend orthogonally to one another), and the first and second wirings M1 and M0 are inclined, thereby connecting the memory cells MC between the paired bit lines BL (for example, BL1 and BL2).

In contrast, in the second embodiment, the first and second wirings M1 and M0 and the upper electrodes UE extend in the row and column direction, respectively (extend orthogonally to one another), and the active areas AA are inclined, thereby connecting the memory cells MC between the paired bit lines BL (for example, BL1 and BL2).

As can be understood, the MRAM according to the first embodiment and that according to the second embodiment are configured similarly in equivalent circuits although the constituent elements inclined in the plan layout differ.

In the second embodiment, each memory cell MC is provided to have a substantially V-shape. The size of the unit cell UC according to the second embodiment is also $8F^2$.

Operations of the MRAM according to the second embodiment other than those explained above are identical to those of the first embodiment, and therefore explanations thereof will be omitted.

According to the second embodiment, the first and second wirings M1 and M0 extend linearly in the column direction so as to overlap with the MTJ elements in each active area column CAA. This can facilitate processing the first and second wirings M1 and M0 in the manufacturing process. In addition, the second embodiment has effects identical to those in the first embodiment.

Third Embodiment

Figure 6:
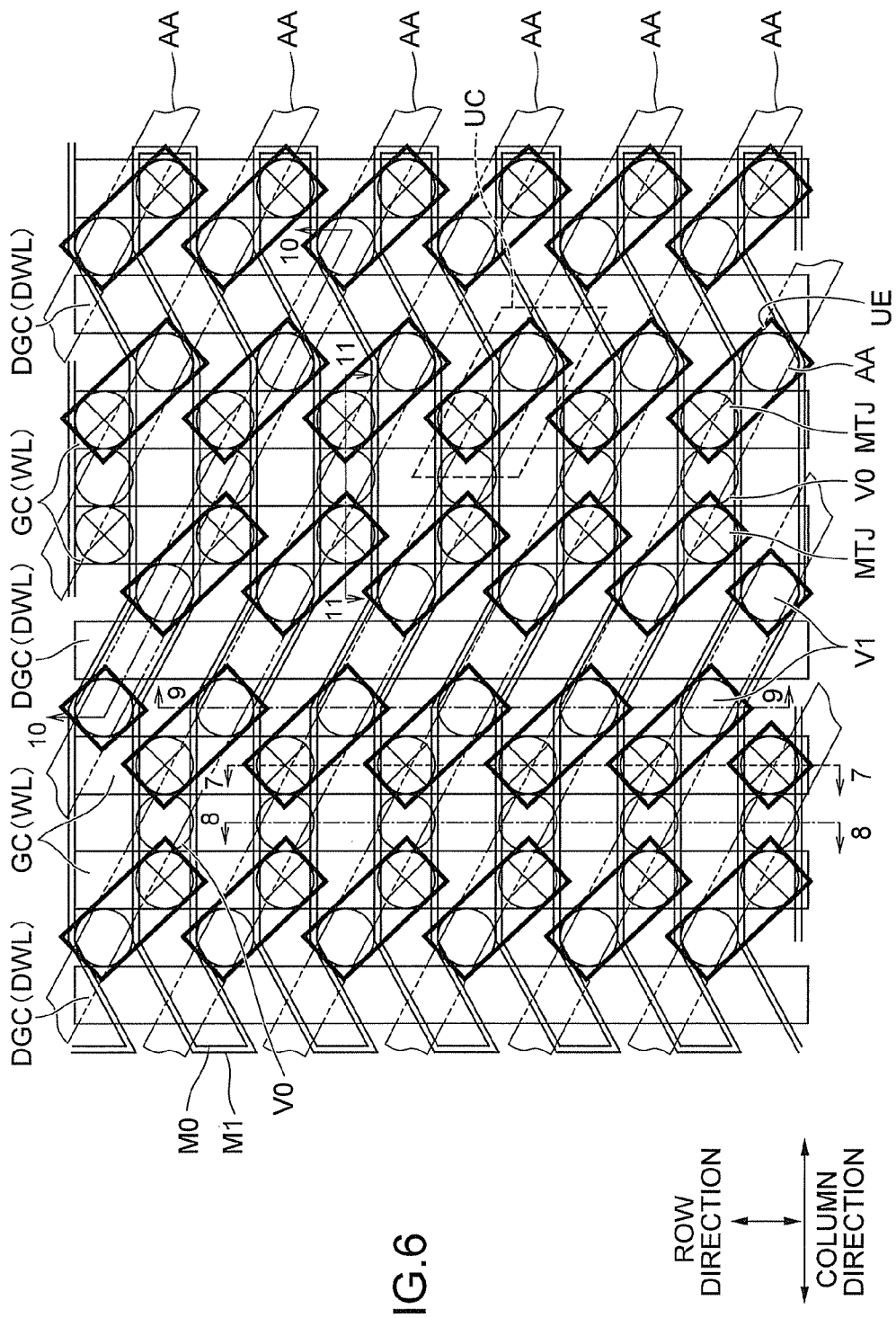
FIG. 6 is a plan layout view of an MRAM according to a third embodiment.
Figure 7:
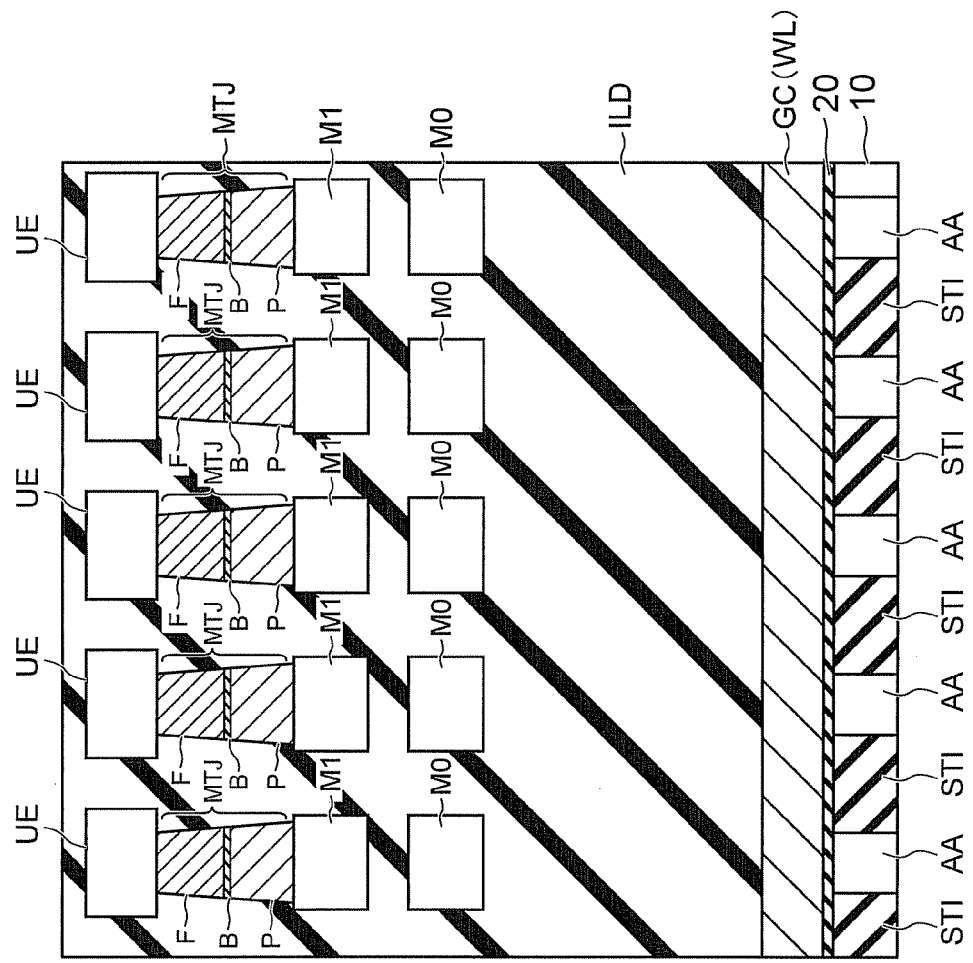
FIG. 7 is a cross-sectional view taken along a line 7-7 of FIG. 6.
Figure 8:
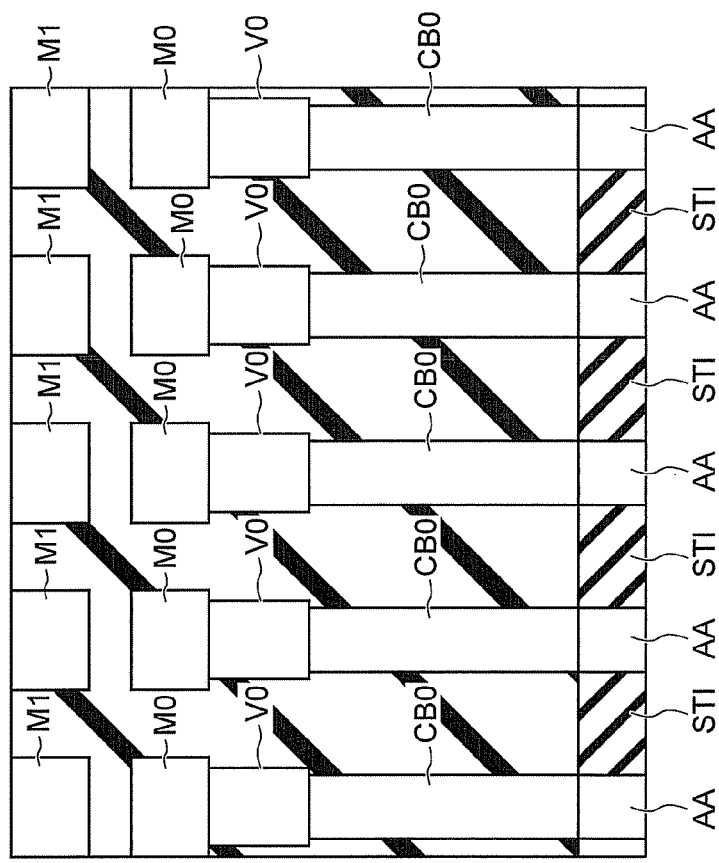
FIG. 8 is a cross-sectional view taken along a line 8-8 of FIG. 6.
Figure 9:
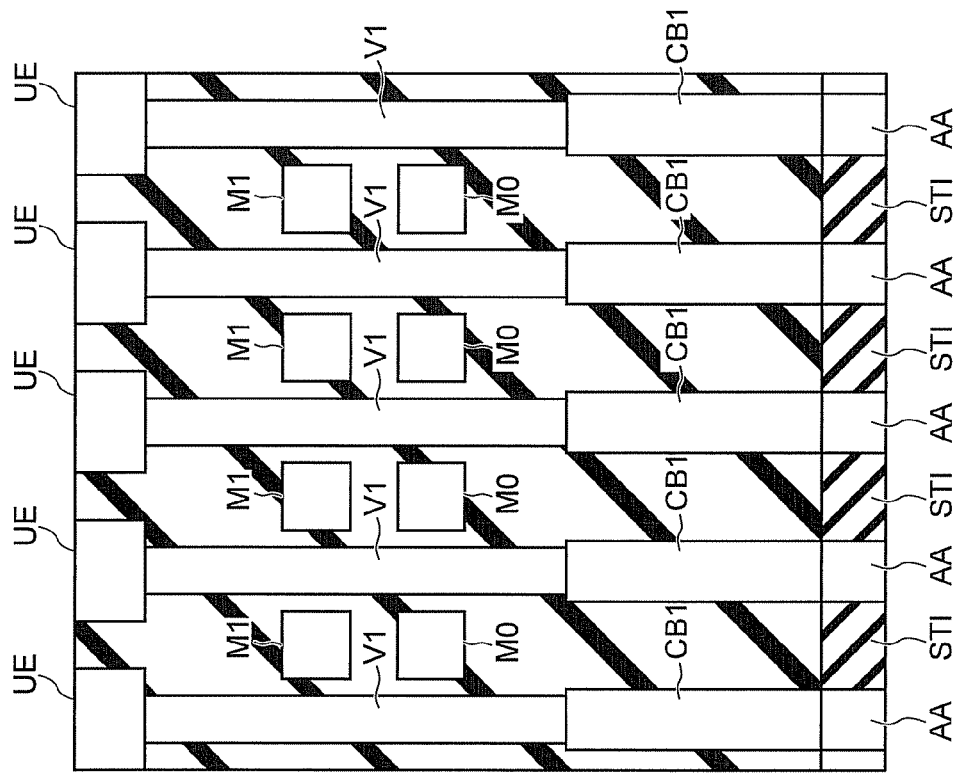
FIG. 9 is a cross-sectional view taken along a line 9-9 of FIG. 6.
Figure 10:
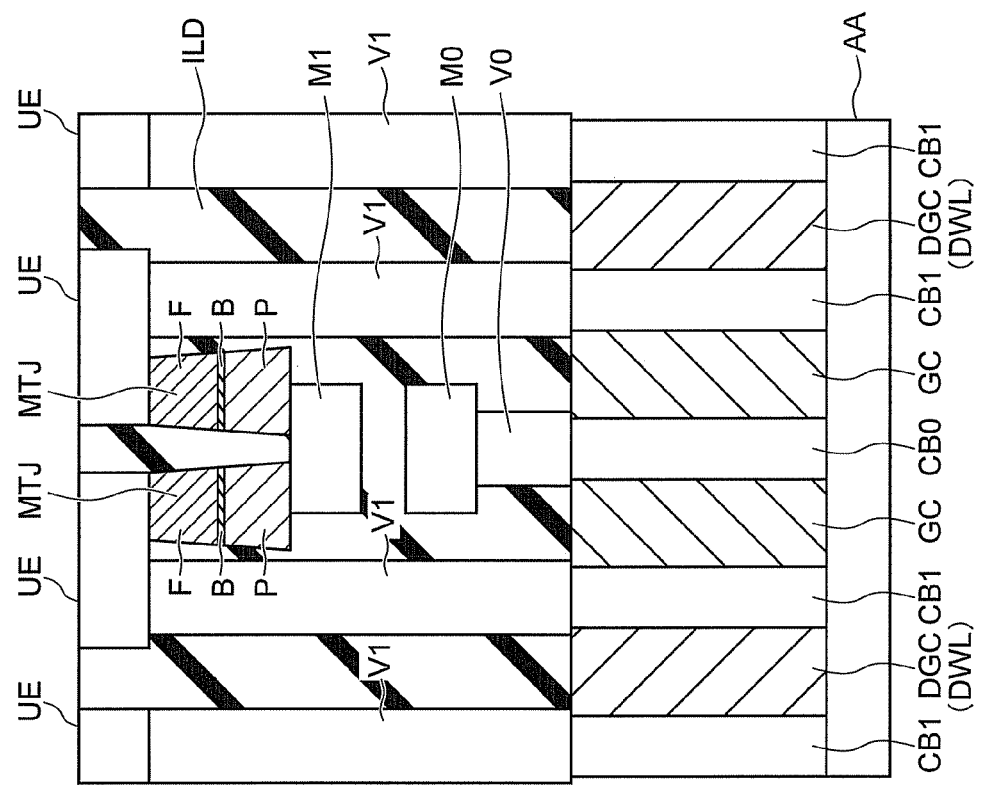
FIG. 10 is a cross-sectional view taken along a line 10-10 of FIG. 6.
Figure 11:
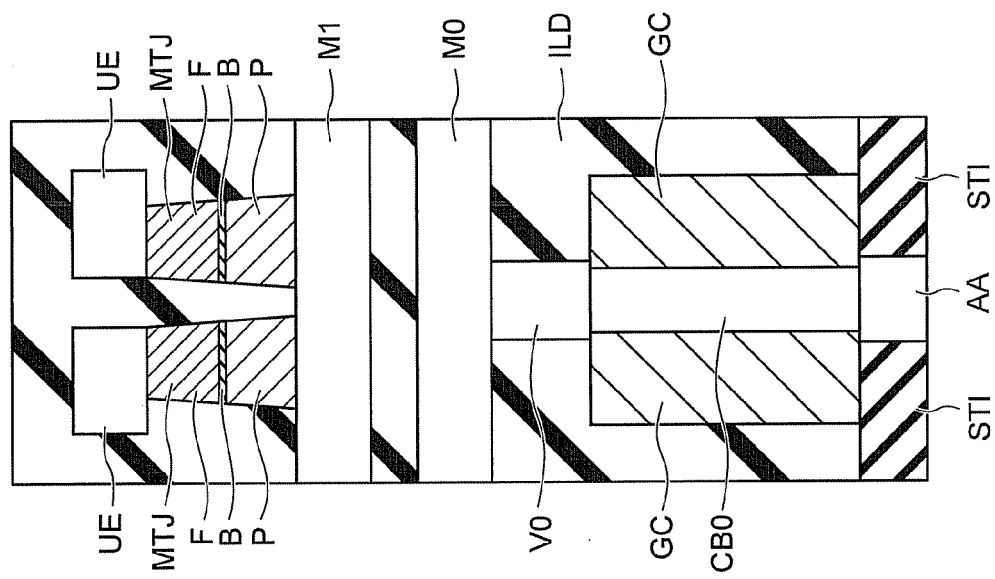
FIG. 11 is a cross-sectional view taken along a line 11-11 of FIG. 6.

FIG. 6 is a plan layout view of an MRAM according to a third embodiment. FIG. 7 is a cross-sectional view taken along a line 7-7 of FIG. 6. FIG. 8 is a cross-sectional view taken along a line 8-8 of FIG. 6. FIG. 9 is a cross-sectional view taken along a line 9-9 of FIG. 6. FIG. 10 is a cross-sectional view taken along a line 10-10 of FIG. 6. FIG. 11 is a cross-sectional view taken along a line 11-11 of FIG. 6.

The active areas AA are separated to correspond to a plurality of cell transistors CT, respectively, and extend in the direction inclined with respect to the row or column direction. In the third embodiment, the active areas AA extend continuously in the direction inclined with respect to the row or column direction in the plan layout, and the cell transistors CT of a plurality of memory cells MC are formed on the respective active areas AA. Each cell transistor CT is formed to provide a channel at the intersection between the active area AA and the gate electrode CG (the word line WL).

Each MTJ element is arranged in a direction inclined from the via contact V1 that connects the upper electrode UE to one end of the cell transistor CT with respect to the row or column direction. In the third embodiment, the MTJ element is located in the direction at about 45 degrees with respect to the via contact V1 in the row or column direction. Accordingly, each upper electrode UE extends in the direction inclined with respect to the row or column direction so as to connect the free layer F of the MTJ element to the via contact V1. For example, the extending direction of the upper electrode UE is at about 45 degrees with respect to the row or column direction.

The two MTJ elements adjacent in the column direction are arranged on both sides of one via contact V0 shared between the two memory cells MC including the MTJ elements, respectively. Therefore, the two cell transistors CT included in the two memory cells MC share one via contact V0, and are electrically connected to the second wiring M0 via the via contact V0.

The inclination angle of the extending direction of the active areas AA with respect to the column direction is smaller than that of the extending direction of the upper electrodes UE. The extending direction of the active areas AA is inclined at about 63.435 degrees (63.435 degrees=(90−a tan(1/2)) degrees) with respect to the row direction. The reason for the inclination of the active areas AA in this way is as follows. The two MTJ elements share one via contact V0 and constitute the two memory cells MC, respectively. Pairs of memory cells MC are repeatedly arranged along the active areas AA. A minimum unit length of this repeated arrangement of the memory cells MC is three pitches, where a pitch is a wiring space pitch of the gate electrodes GC. Furthermore, pairs of memory cells MC are repeatedly arranged along the gate electrodes GC. A minimum unit length of this repeated arrangement is 1.5 pitches, where a pitch is a wiring space pitch of the wirings M0 and M1.

Because the wiring space pitch of the gate electrodes GC is identical to that of the wirings M0 and M1, the angle between the active areas AA and the gate electrodes GC is (90−a tan(1×1.5/3)) degrees=(90−a tan(1/2)) degrees.

Therefore, the MTJ elements are arranged at positions slightly shifted from above the active areas AA in the row direction as shown in FIG. 7. On the other hand, the via contacts V0 are above the active areas AA as shown in FIG. 8, and overlap with the active areas AA in the plan layout. The two adjacent MTJ elements can be thereby arranged on the both sides of the common via contact V0 in the column direction, respectively. That is, as shown in FIG. 11, the via contact V0 and the two MTJ elements located on the both sides of the via contact V0, respectively, are arranged linearly along the column direction. Therefore, in each of plan layout regions in which the two MTJ elements and the via contact V0 are present, the first and second wirings M1 and M0 can extend linearly in the column direction while overlapping with the two MTJ elements and the via contact V0.

On the other hand, one via contact V1 is adjacent to the other via contact V1 in the extending direction of the active areas AA as shown in FIG. 10. A dummy gate electrode DGC (a dummy word line DWL) is provided between the two adjacent via contacts V1. In a plan layout region in which the dummy gate electrode DGC and the two via contacts V1 located on both sides of the dummy gate electrode DGC, respectively, are present, the first and second wirings M1 and M0 extend in the direction inclined with respect to the row or column direction so as to pass through a part between the two via contacts V1 adjacent in the row direction. FIG. 9 shows how the first and second wirings M0 and M1 pass through the part between the two via contacts V1 adjacent in the row direction. In the plan layout region in which the two via contacts V1 and the dummy gate electrode DGC are present, the extending direction of the first and second wirings M1 and M0 is either equal to the extending direction of the active areas AA or an inversion direction of the extending direction of the active areas AA about the column direction.

As can be understood from the above explanations, the first and second wirings M1 and M0 extend in the column direction in each of regions in which the via contact V0 and the two adjacent MTJ elements located on the both sides of the via contact V0, respectively, are present, and are inclined in the other regions (in each of which the dummy gate electrode DGC and the two via contacts V1 located on the both sides of the dummy gate electrode DGC, respectively, are present). As a result, the first and second wirings M1 and M0 meander as shown in FIG. 6.

The size of the unit cell UC according to the third embodiment is $6F^2$ (3F×2F). The MRAM according to the third embodiment can be downsized to the same extent as the DRAM because of the plan layout of the MRAM. The MRAM according to the third embodiment can be used in place of the DRAM. The MRAM can be also used in place of an EEPROM because the MRAM is a nonvolatile memory.

Basic configurations of the MRAM according to the third embodiment are identical to those shown in FIGS. 1 and 2. Therefore, configurations of the third embodiment other than those explained above can be identical to corresponding ones of the first embodiment.

In the third embodiment, the MTJ elements are not arranged in a square grid pattern in the plan layout. However, the third embodiment has effects identical to those in the first embodiment in other aspects.

Fourth Embodiment

Figure 12:
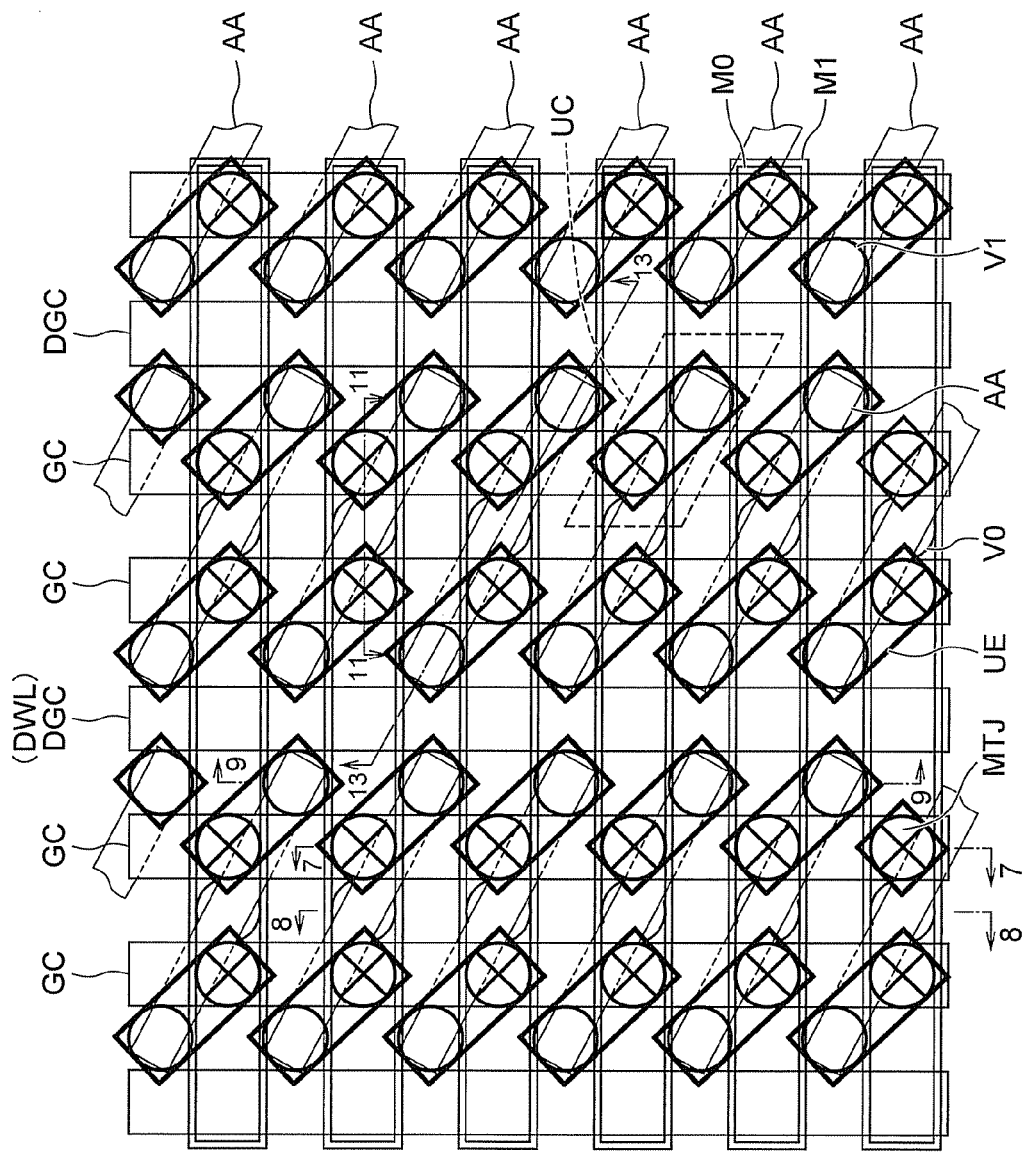
FIG. 12 is a plan layout view of an MRAM according to a fourth embodiment.
Figure 13:
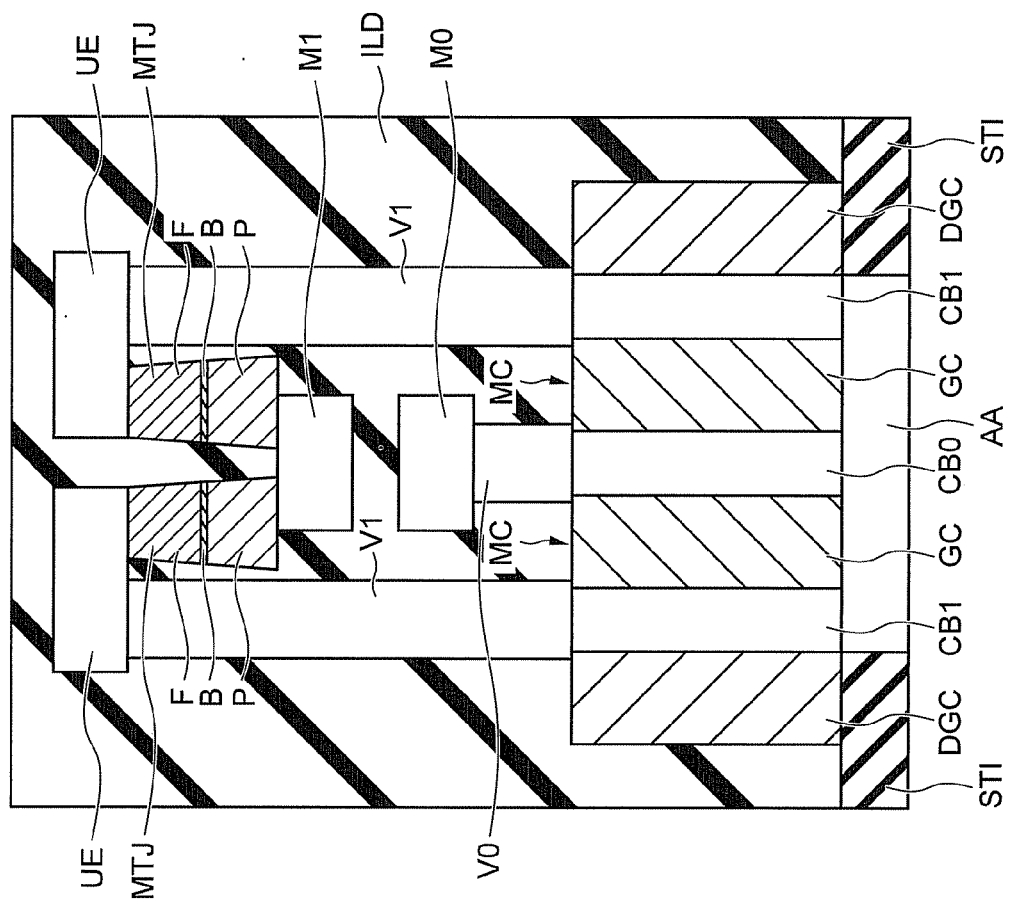
FIG. 13 is a cross-sectional view taken along a line 13-13 of FIG. 12.

FIG. 12 is a plan layout view of an MRAM according to a fourth embodiment. A cross-section taken along a line 7-7 of FIG. 12 corresponds to the cross-sectional view of FIG. 7. A cross-section taken along a line 8-8 of FIG. 12 corresponds to the cross-sectional view of FIG. 8. A cross-section taken along a line 9-9 of FIG. 12 corresponds to the cross-sectional view of FIG. 9. A cross-section taken along a line 11-11 of FIG. 12 corresponds to the cross-sectional view of FIG. 11. FIG. 13 is a cross-sectional view taken along a line 13-13 of FIG. 12.

In the fourth embodiment, the active areas AA extend in the direction inclined with respect to the row or column direction but do not extend continuously. As shown in FIG. 13, the active areas AA are separated to correspond to respective pairs of memory cells MC each pair of which share one via contact V0 and are adjacent to each other. That is, the active areas AA are separated to correspond to respective pairs of cell transistors CT each pair of which are commonly connected to one via contact V0.

The extending direction of each active area AA is inclined at about 63.435 degrees (63.435 degrees=(90−a tan(1/2)) degrees) with respect to the row direction for the reason already described in the third embodiment. Pairs of memory cells MC are repeatedly arranged along the active areas AA. The minimum unit length of this repeated arrangement is three pitches, where a pitch is the wiring space pitch of the gate electrodes GC. Furthermore, pairs of memory cells MC are repeatedly arranged along the gate electrodes GC. The minimum unit length of this repetition is 1.5 pitches, where a pitch is the wiring space pitch of the wirings M0 and M1.

Furthermore, a plurality of active areas AA are arranged to be staggered from one another by 6F in the column direction and by 2F in the row direction.

With this arrangement, the first and second wirings M1 and M0 can be arranged to extend linearly in the column direction in both each of the regions where the via contact V0 and the two adjacent MTJ elements located on the both sides of the via contact V0 are present and each of the regions where the dummy gate electrode DGC and the two via contacts V1 located on the both sides of the dummy gate electrode DGC are present.

Other configurations of the fourth embodiment can be identical to corresponding ones of the third embodiment.

According to the fourth embodiment, the first and second wirings M1 and M0 can be easily processed in the manufacturing process because the first and second wirings M1 and M0 can be formed linearly. Furthermore, the fourth embodiment also has effects identical to those in the third embodiment. The size of the unit cell UC according to the fourth embodiment is also $6F^2$.

Fifth Embodiment

Figure 14:
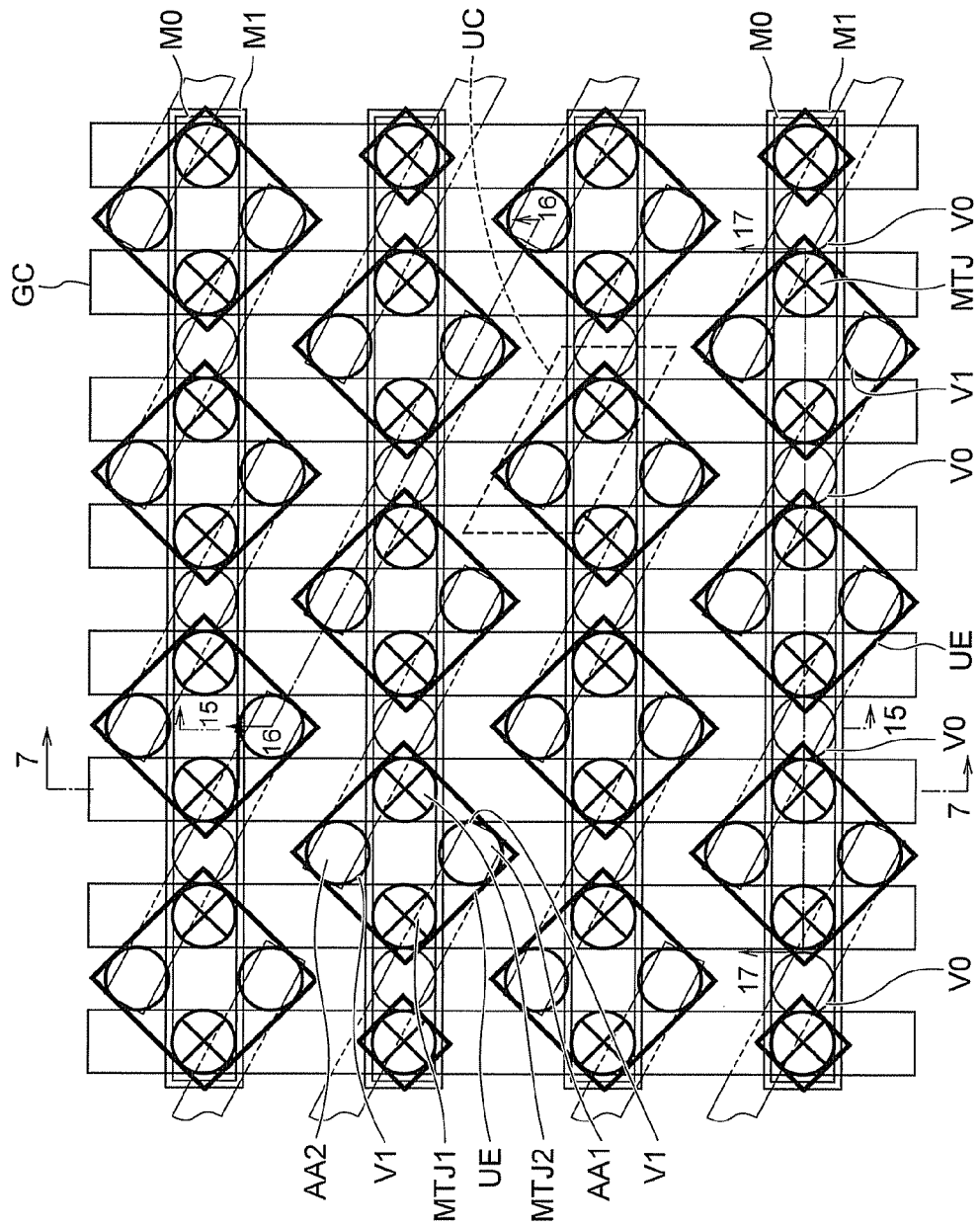
FIG. 14 is a plan layout view of an MRAM according to a fifth embodiment.
Figure 15:
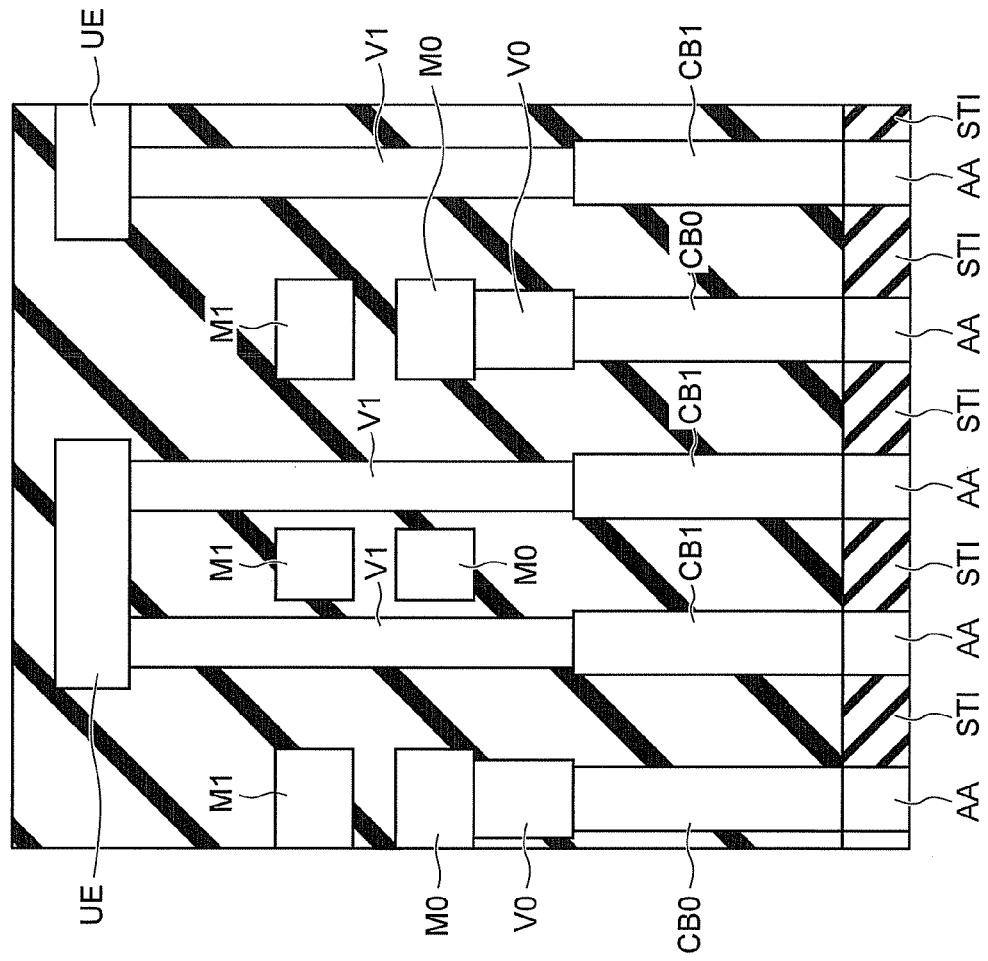
FIG. 15 is a cross-sectional view taken along a line 15-15 of FIG. 14.
Figure 16:
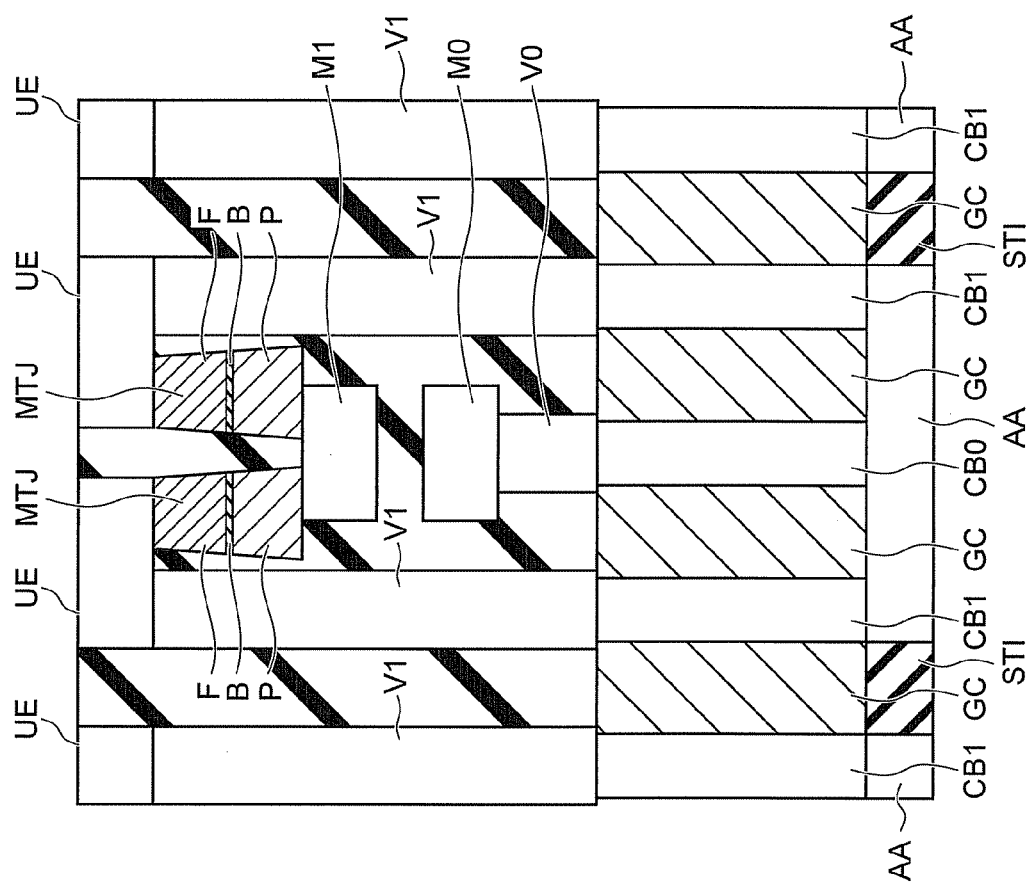
FIG. 16 is a cross-sectional view taken along a line 16-16 of FIG. 16.
Figure 17:
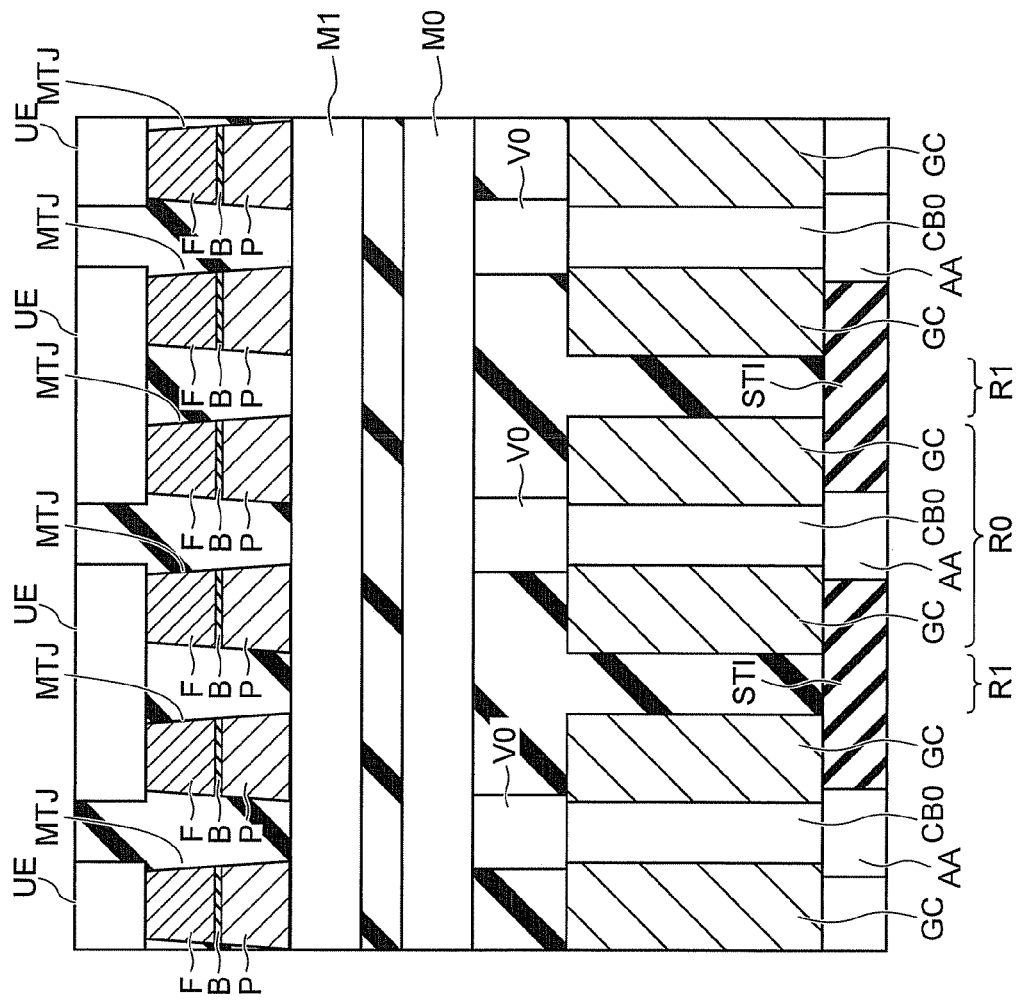
FIG. 17 is a cross-sectional view taken along a line 17-17 of FIG. 14

FIG. 14 is a plan layout view of an MRAM according to a fifth embodiment. A cross-section taken along a line 7-7 of FIG. 14 corresponds to the cross-sectional view of FIG. 7. FIG. 15 is a cross-sectional view taken along a line 15-15 of FIG. 14. FIG. 16 is a cross-sectional view taken along a line 16-16 of FIG. 16. FIG. 17 is a cross-sectional view taken along a line 17-17 of FIG. 14.

In the fifth embodiment, the active areas AA extend in the direction inclined with respect to the row or column direction but do not extend continuously. The active areas AA are separated to correspond to respective pairs of memory cells MC each pair of which share one via contact V0 and are adjacent to each other. That is, the active areas AA are separated to correspond to respective pairs of cell transistors CT each pair of which are commonly connected to one via contact V0 as shown in FIG. 16.

The extending direction of the active areas AA is inclined at about 63.435 degrees (63.435 degrees=(90−a tan(1/2)) degrees) with respect to the row direction for the following reason. The two MTJ elements share one via contact V0 and constitute the two memory cells MC, respectively. Pairs of memory cells MC are arranged repeatedly along the active areas AA. The minimum unit length of this repeated arrangement is three pitches, where a pitch is the wiring space pitch of the gate electrodes GC. Furthermore, the pairs of memory cells MC are repeatedly arranged along the gate electrodes GC. The minimum unit length of this repeated arrangement is 1.5 pitches, where a pitch is the wiring space pitch of the wirings M0 and M1. Therefore, the angle between the active area AA and the gate electrode GC is (90−a tan(1×1.5/3)) degrees=(90−a tan(1/2)) degrees.

A plurality of active areas AA adjacent in the column direction are arranged to be staggered from one another by 4F in the column direction. A plurality of active areas AA adjacent in the column direction are arranged in line in the row direction without being staggered.

With this arrangement, the first and second wirings M1 and M0 can be arranged to extend linearly in the column direction in both regions (R0) in each of which the via contact V0 and the two adjacent MTJ elements located on the both sides of the via contact V0, respectively, are present and the other regions (R1).

Furthermore, in the fifth embodiment, each upper electrode UE electrically connects the free layers F of the two MTJ elements adjacent in the column direction to the two via contacts V1 adjacent in the row direction.

For example, as shown in FIG. 14, the upper electrode UE electrically connects a first MTJ element MTJ1 overlapping with a first active area AA1, the via contact V1 that connects the free layer F of the first MTJ element MTJ1 to the first active area AA1, a second MTJ element MTJ2 overlapping with a second active area AA2 adjacent to the first active area AA1, and the via contact V1 that connects the free layer F of the second MTJ element MTJ2 to the second active area AA2 to one another.

The dummy gate electrodes DGC (the dummy word lines DWL) are not provided in the MRAM according to the fifth embodiment. Configurations of the fifth embodiment other than those explained above can be identical to corresponding ones of the fourth embodiment.

In this way, a layout area can be increased because each upper electrode UE connects the two MTJ elements and the two via contacts V1 to one another. Furthermore, the upper electrodes UE are arranged equidistantly and uniformly in the row and column directions in the plan layout. This can facilitate processing the upper electrodes UE by the lithography and etching at the time of processing the upper electrodes UE.

Furthermore, according to the fifth embodiment, the first and second wirings M1 and M0 can be easily processed in the manufacturing process because the first and second wirings M1 and M0 can be formed linearly. In addition, the fifth embodiment also has effects identical to those in the fourth embodiment. The size of the unit cell UC according to the fifth embodiment is also $6F^2$.

Sixth Embodiment

Figure 18:
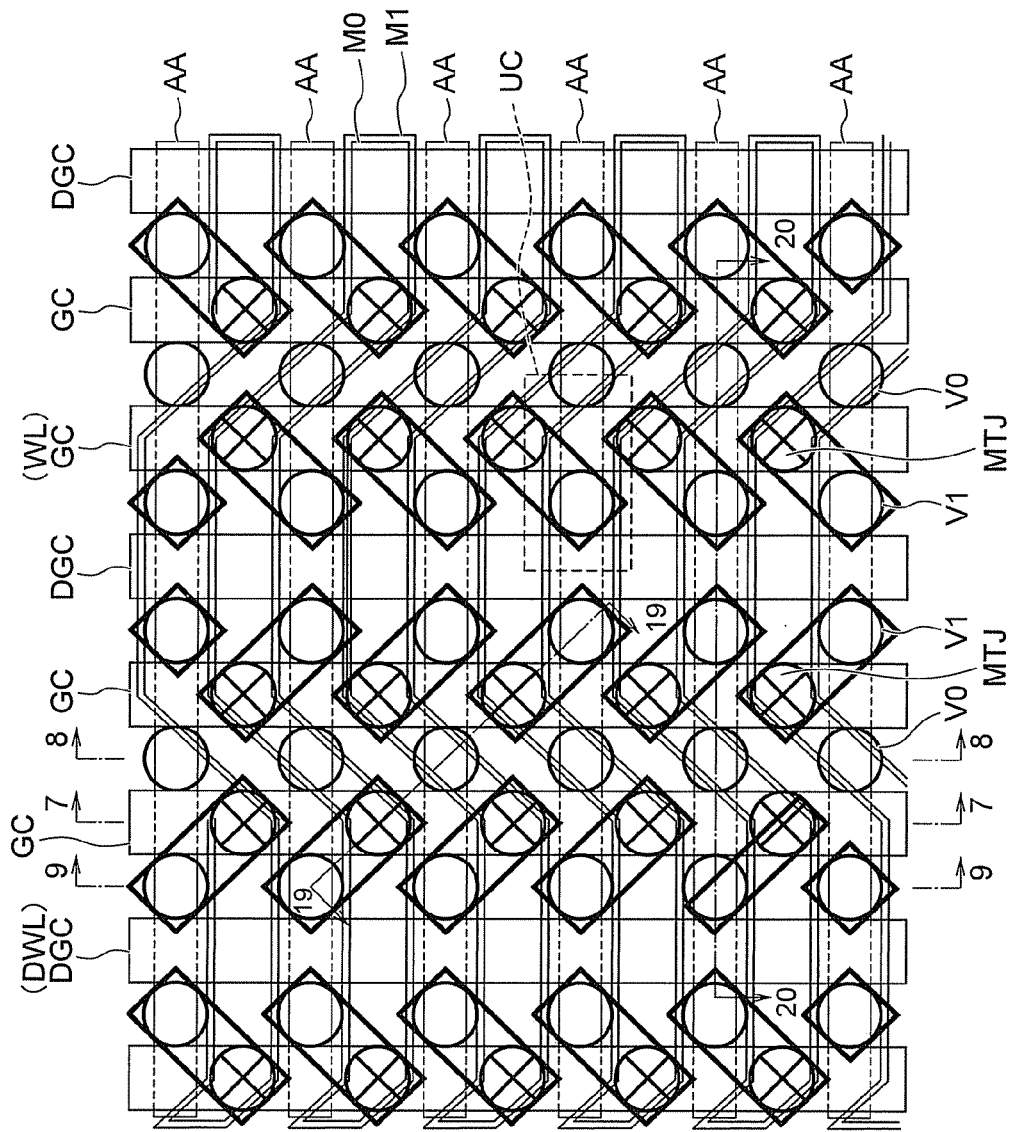
FIG. 18 is a plan layout view of an MRAM according to a sixth embodiment.
Figure 19:
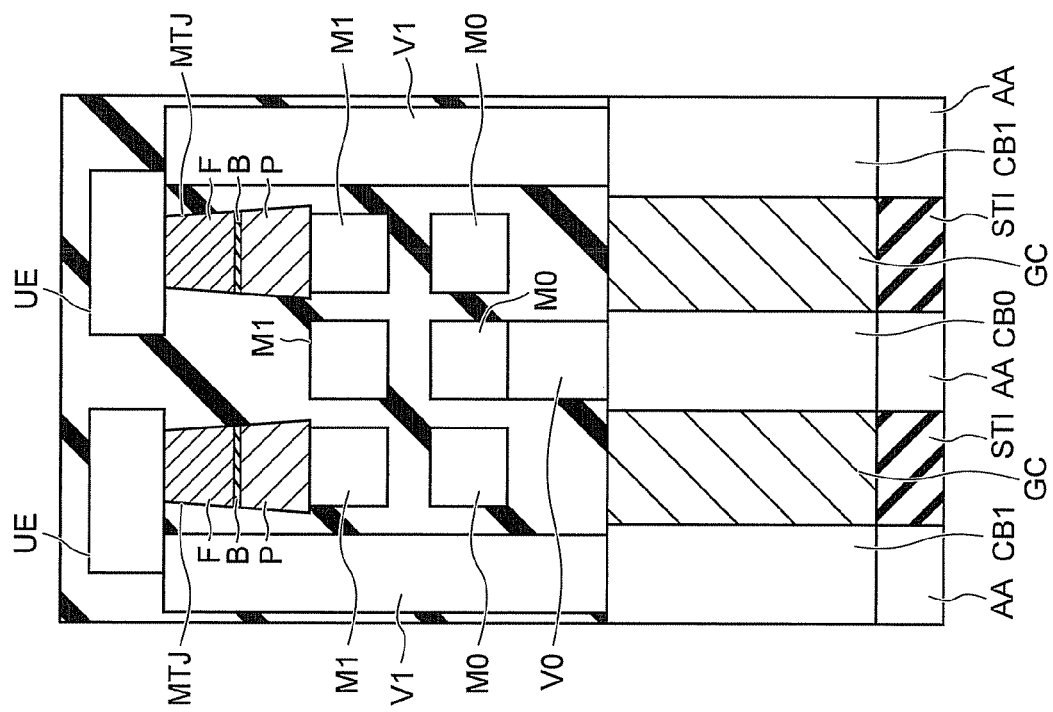
FIG. 19 is a cross-sectional view taken along a line 19-19 of FIG. 18.
Figure 20:
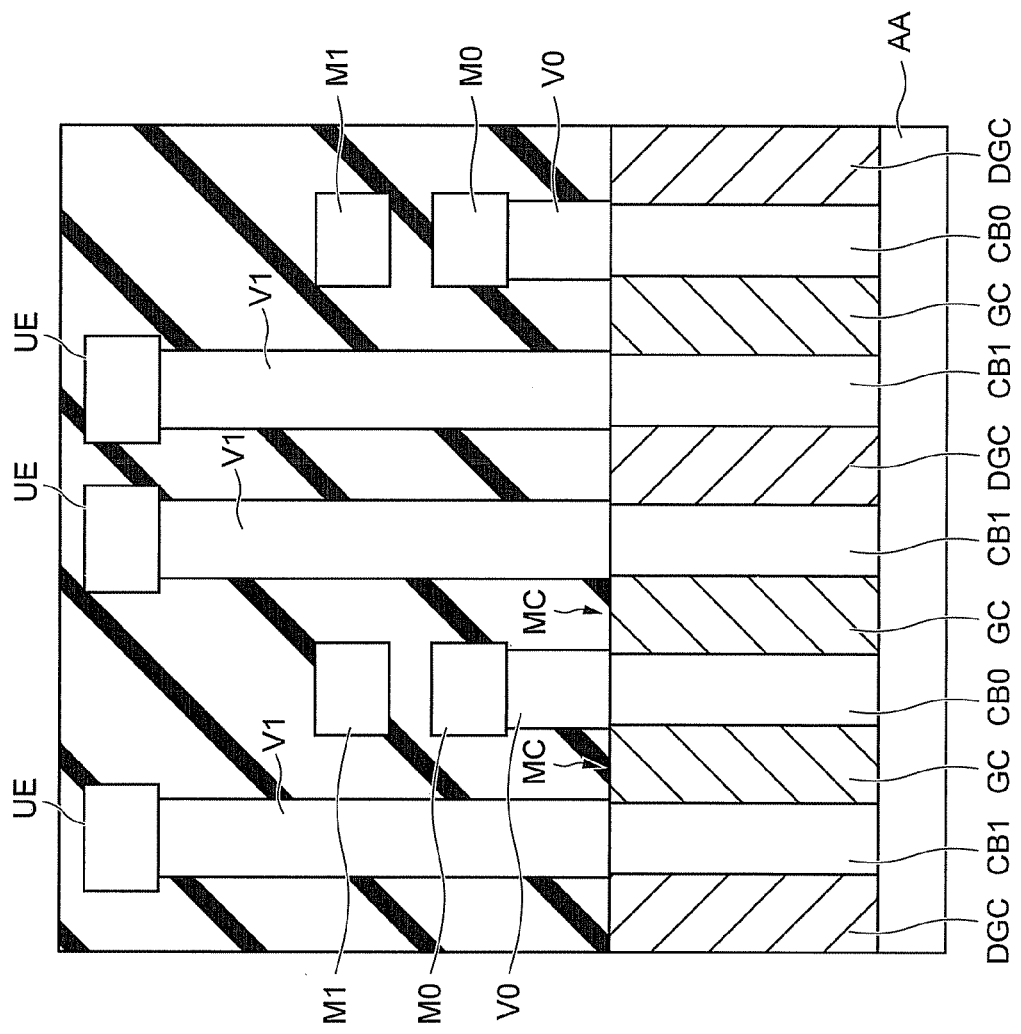
FIG. 20 is a cross-sectional view taken along a line 20-20 of FIG. 20.

FIG. 18 is a plan layout view of an MRAM according to a sixth embodiment. A cross-section taken along a line 7-7 of FIG. 18 corresponds to the cross-sectional view of FIG. 7. A cross-section taken along a line 8-8 of FIG. 18 corresponds to the cross-sectional view of FIG. 8. A cross-section taken along a line 9-9 of FIG. 18 corresponds to the cross-sectional view of FIG. 9. FIG. 19 is a cross-sectional view taken along a line 19-19 of FIG. 18. FIG. 20 is a cross-sectional view taken along a line 20-20 of FIG. 20.

In the sixth embodiment, the active areas AA extend linearly in the column direction. Because of the linear extension of the active areas AA in the column direction, the via contacts V0 and V1 are arranged linearly in the column direction as shown in FIG. 20.

Accordingly, the MTJ elements are arranged in the direction inclined from the via contacts V1 with respect to the row or column direction, and in the direction inclined from the via contacts V0 with respect to the row or column direction. For example, the MTJ elements are arranged in the direction inclined, at about 45 degrees from the via contacts V0 and V1 with respect to the row or column direction.

Each upper electrode UE extends in the direction inclined with respect to the row or column direction so as to connect the free layer F of each MTJ element to one via contact V1. For example, the upper electrode UE extends in the direction inclined, at about 45 degrees with respect to the row or column direction.

As shown in FIG. 20, the two adjacent memory cells MC located on the both sides of one via contact V0 share the via contact V0. Therefore, the adjacent cell transistors CT located on the both sides of the via contact V0 are commonly connected to the via contact V0.

In the plan layout region in which one via contact V0 and the two adjacent MTJ elements located in the direction inclined from the via contact V0 are present, the first and second wirings M1 and M0 extend in the direction inclined with respect to the row or column direction while overlapping with the via contact V0 and the two MTJ elements.

On the other hand, the dummy gate electrode DGC (the dummy word line DWL) is provided between the two adjacent via contacts V1. In a plan layout region in which the dummy gate electrode DGC and the via contacts V1 located on the both sides of the dummy gate electrode DGC, respectively, are present, the first and second wirings M1 and M0 extend linearly in the column direction so as to pass through the part between the two via contacts V1 adjacent in the row direction.

As can be understood from the above explanations, the first and second wirings M1 and M0 extend in the row or column direction in each of the regions in which the via contact V0 and the two adjacent MTJ elements located on the both sides of the via contact V0, respectively, are present, and are inclined in the other regions (in each of which the dummy gate electrode GC and the two via contacts V1 located on the both sides of the dummy gate electrode GC, respectively, are present). As a result, the first and second wirings M1 and M0 meander as shown in FIG. 13.

In such a plan layout, the active areas AA are orthogonal to the gate electrodes GC. In this case, an area of a channel region covered with each gate electrode GC is wider than that of a channel region covered with each gate electrode GC intersecting the active area AA at an inclined angle when a fully depleted FinFET is used as the cell transistor CT. It is thereby possibly to satisfactorily control a channel potential of each cell transistor CT and improve the current driving capability of the cell transistor CT.

Furthermore, the sixth embodiment also has effects identical to those of the fourth embodiment. The size of the unit cell UC according to the sixth embodiment is also $6F^2$.

In the second and fourth to sixth embodiments, the MTJ elements are provided to correspond to all the intersections between a plurality of rows and a plurality of columns, respectively. Therefore, at the time of etching the MTJ elements, the MTJ elements can be formed using a plurality of sidewalls formed in the row and column directions as a mask. This enables the MTJ elements to be processed without using the lithography, thereby reducing the MRAM manufacturing process. Furthermore, the sidewalls can be formed to have a size smaller than the minimum feature size F. Therefore, by using this sidewall mask processing technique, the MTJ elements can be further downscaled.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
    a magnetic tunnel junction element comprising a pinned layer having a fixed magnetization orientation, a tunnel dielectric film provided on the pinned layer, and a recording layer provided on the tunnel dielectric film and having a variable magnetization orientation;
    a first wiring electrically connected to the pinned layer;
    an upper electrode electrically connected to the recording layer;
    a cell transistor having one end electrically connected to the recording layer via the upper electrode; and
    a second wiring electrically connected to the other end of the cell transistor, and provided below the first wiring so as to be electrically isolated from the first wiring, wherein
    a plurality of the magnetic tunnel junction elements and a plurality of the cell transistors are provided,
    the semiconductor storage device further comprises a plurality of active areas separated to correspond to the cell transistors, respectively, and extending in a first direction substantially orthogonal to an extending direction of gates of the cell transistors,
    the active areas are arranged in the first direction and constitute a plurality of active area columns,
    the two active area columns adjacent in a second direction substantially parallel to the extending direction of the gates of the cell transistors are arranged so as to be half-pitch staggered in the first direction, and
    as viewed from above surfaces of the active areas, the magnetic tunnel junction elements is respectively arranged to overlap with one end of each active area, and the first and second wirings extend while being folded back in a direction inclined with respect to the first and second directions in order to overlap with the magnetic tunnel junction elements alternately in the two adjacent active area columns.

2. The device of claim 1, wherein the first and second wirings extend while repeatedly creating a W-shape in order to overlap with the magnetic tunnel junction elements alternately in the two adjacent active area columns.

3. A semiconductor storage device comprising:
a magnetic tunnel junction element comprising a pinned layer having a fixed magnetization orientation, a tunnel dielectric film provided on the pinned layer, and a recording layer provided on the tunnel dielectric film and having a variable magnetization orientation;
a first wiring electrically connected to the pinned layer;
an upper electrode electrically connected to the recording layer;
a cell transistor having one end electrically connected to the recording layer via the upper electrode; and
a second wiring electrically connected to the other end of the cell transistor, and provided below the first wiring so as to be electrically isolated from the first wiring, wherein
a plurality of the magnetic tunnel junction elements and a plurality of the cell transistors are provided,
the semiconductor storage device further comprises a plurality of active areas separated to correspond to the cell transistors, respectively, and extending in a direction inclined with respect to an extending direction of gates of the cell transistors,
the active areas are arranged in a first direction substantially orthogonal to the extending direction of the gates of the cell transistors, and constitute a plurality of active area columns, and
as viewed from above surfaces of the active areas, the magnetic tunnel junction elements is respectively arranged to overlap with one end of each of the active areas, and the first and second wirings extend linearly in the first direction in order to overlap with the magnetic tunnel junction elements in each of the active area columns, wherein:
the upper electrode connects the recording layer of one of the magnetic tunnel junction elements provided above a first active area of the active area to the one end of one of the cell transistors in a second active area adjacent to the first active area, and
the upper electrode connects the one magnetic tunnel junction element and the one cell transistor in series between the first wiring and the second wiring.

4. The device of claim 1, wherein the upper electrode connects the recording layer of one of the magnetic tunnel junction elements provided above a first active area of the active area to the one end of one of the cell transistors in a second active area adjacent to the first active area, and
the upper electrode connects the one magnetic tunnel junction element and the one cell transistor in series between the first wiring and the second wiring.

5. The device of claim 2, wherein the upper electrode connects the recording layer of one of the magnetic tunnel junction elements provided above a first active area of the active area to the one end of one of the cell transistors in a second active area adjacent to the first active area, and
the upper electrode connects the one magnetic tunnel junction element and the one cell transistor in series between the first wiring and the second wiring.

6. The device of claim 4, wherein the upper electrode extends in the extending direction of the gates of the cell transistors.

7. A semiconductor storage device comprising:
a magnetic tunnel junction element comprising a pinned layer having a fixed magnetization orientation, a tunnel dielectric film provided on the pinned layer, and a recording layer provided on the tunnel dielectric film and having a variable magnetization orientation;
a first wiring electrically connected to the pinned layer;
an upper electrode electrically connected to the recording layer;
a cell transistor having one end electrically connected to the recording layer via the upper electrode; and
a second wiring electrically connected to the other end of the cell transistor, and provided below the first wiring so as to be electrically isolated from the first wiring, wherein
a plurality of the magnetic tunnel junction elements and a plurality of the cell transistors are provided,
the semiconductor storage device further comprises a plurality of active areas separated to correspond to the cell transistors, respectively, and extending in a direction inclined with respect to an extending direction of gates of the cell transistors,
each one of the magnetic tunnel junction elements is arranged in the direction inclined from a first contact between the upper electrode and the one end of one of the cell transistors with respect to the extending direction of the gates of the cell transistors,
the upper electrode extends in the direction inclined with respect to the extending direction of the gates of the cell transistors in order to connect the recording layer of the one magnetic tunnel junction element to the first contact,
two of the magnetic tunnel junction elements adjacent to each other in a direction substantially orthogonal to the extending direction of the gates of the cell transistors are arranged on both sides of a second contact, respectively, the second contact connecting between the second wiring and the other end of the one cell transistor, and
the two adjacent cell transistors provided on the both sides of the second contact respectively share the second contact.

8. The device of claim 7, wherein, as viewed from above surfaces of the active areas, the first and second wirings extend in the direction substantially orthogonal to the extending direction of the gates of the cell transistors in order to overlap with the second contact and the two adjacent magnetic tunnel junction elements provided on the both sides of the second contact, respectively, in a region in which the second contact and the two adjacent magnetic tunnel junction elements are present, and
the first and second wirings extend in the direction inclined with respect to the extending direction of the gates of the cell transistors in regions other than the region.

9. The device of claim 8, wherein the first and second wirings are arranged to meander.

10. The device of claim 7, wherein, as viewed from above surfaces of the active areas, the first and second wirings extend linearly in the direction substantially orthogonal to the extending direction of the gates of the cell transistors in order to overlap with the second contact and the two adjacent magnetic tunnel junction elements provided on the both sides of the second contact, respectively.

11. The device of claim 10, wherein the active areas are separated to correspond to pairs of cell transistors, respectively, each pair of cell transistors sharing the second contact.

12. The device of claim 7, wherein, as viewed from above surfaces of the active areas, the upper electrode electrically and mutually connects a first magnetic tunnel junction element the overlapping with a first active area of the active areas, the first contact connecting the recording layer of the first magnetic tunnel junction element to the first active area, a second magnetic tunnel junction element overlapping with a second active area adjacent to the first active area, and the first contact connecting the recording layer of the second magnetic tunnel junction element to the second area, each of the first and second magnetic tunnel junction elements is one of the magnetic tunnel junction elements.

13. The device of claim 7, wherein, as viewed from above surfaces of the active areas, the active areas are inclined at an angle of (90−a tan(1/2)) degrees with respect to the extending direction of the gates of the cell transistors.

14. The device of claim 8, wherein, as viewed from above surfaces of the active areas, the active areas are inclined at an angle of (90−a tan(1/2)) degrees with respect to the extending direction of the gates of the cell transistors.

15. The device of claim 10, wherein, as viewed from above surfaces of the active areas, the active areas are inclined at an angle of (90−a tan(1/2)) degrees with respect to the extending direction of the gates of the cell transistors.

16. The device of claim 12, wherein, as viewed from above surfaces of the active areas, the active areas are inclined at an angle of (90−a tan(1/2)) degrees with respect to the extending direction of the gates of the cell transistors.

17. A semiconductor storage device comprising:

a magnetic tunnel junction element comprising: a pinned layer having a fixed magnetization orientation; a tunnel dielectric film provided on the pinned layer; and a recording layer provided on the tunnel dielectric film and having a variable magnetization orientation;

a first wiring electrically connected to the pinned layer;

an upper electrode electrically connected to the recording layer;

a cell transistor having one end electrically connected to the recording layer via the upper electrode; and a second wiring electrically connected to the other end of the cell transistor, and provided below the first wiring so as to be electrically isolated from the first wiring, wherein a plurality of the magnetic tunnel junction elements and a plurality of the cell transistors are provided, the semiconductor storage device further comprises a plurality of active areas extending in a direction orthogonal to an extending direction of gates of the cell transistors, the magnetic tunnel junction elements are arranged in a direction inclined with respect to the extending direction of the gates of the cell transistors from a first contact between the upper electrode and the one end of one of the cell transistors, and are arranged in the direction inclined with respect to the extending direction of the gates of the cell transistors from a second contact, the second contact connecting the second wiring to the other end of the one cell transistor, the upper electrode extends in the direction inclined with respect to the extending direction of the gates of the cell transistors in order to connect the recording layer of the one magnetic tunnel junction elements to the first contact, and two adjacent cell transistors provided on both sides of the second contact, respectively share the second contact.

18. The device of claim 17, wherein, as viewed from above surfaces of the active areas, the first and second wirings extend in the direction inclined with respect to the extending direction of the gates of the cell transistors in order to overlap with the second contact and two magnetic tunnel junction elements sharing the second contact, in a region in which the second contact and the two magnetic tunnel junction elements are present, and the first and second wirings extend in a direction substantially orthogonal to the extending direction of the gates of the cell transistors in regions other than the region.

\* \* \* \* \*